(12) United States Patent
Kim et al.

(10) Patent No.: US 7,902,607 B2
(45) Date of Patent: Mar. 8, 2011

(54) FABRICATION OF LOCAL DAMASCENE FINFETS USING CONTACT TYPE NITRIDE DAMASCENE MASK

(75) Inventors: Yong-Sung Kim, Seoul (KR); Tae-Young Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 248 days.

(21) Appl. No.: 12/318,238

(22) Filed: Dec. 23, 2008

(65) Prior Publication Data

US 2009/0121292 A1 May 14, 2009

Related U.S. Application Data

(63) Continuation of application No. 11/508,992, filed on Aug. 24, 2006, now Pat. No. 7,488,654.

(30) Foreign Application Priority Data

Nov. 14, 2005 (KR) .......................... 10-2005-0108796

(51) Int. Cl.
*H01L 21/331* (2006.01)
(52) U.S. Cl. ................................ 257/365; 257/E29.264
(58) Field of Classification Search .................. 257/365, 257/E29.264
See application file for complete search history.

(56) References Cited

U.S. PATENT DOCUMENTS

| 6,664,582 | B2 | 12/2003 | Fried |
| 6,876,042 | B1 | 4/2005 | Yu |
| 7,015,106 | B2 | 3/2006 | Yoon et al. |
| 7,288,823 | B2 | 10/2007 | Youn et al. |
| 2004/0217420 | A1 | 11/2004 | Yeo et al. |
| 2005/0041321 | A1 | 2/2005 | Settje |
| 2005/0064067 | A1 | 3/2005 | Schmitt |
| 2005/0095794 | A1 | 5/2005 | Park |
| 2005/0153490 | A1 | 7/2005 | Yoon et al. |
| 2005/0167754 | A1 | 8/2005 | Kang et al. |
| 2005/0170593 | A1 | 8/2005 | Kang et al. |
| 2005/0239252 | A1 | 10/2005 | Ahn et al. |

FOREIGN PATENT DOCUMENTS

KR  10-2005-0060176  6/2005

OTHER PUBLICATIONS

Office Action for Chinese patent application No. 200610144646.2 dated Jul. 18, 2008 and English translation thereof.

*Primary Examiner* — Charles D Garber
*Assistant Examiner* — Stanetta D Isaac
(74) *Attorney, Agent, or Firm* — Harness, Dickey & Pierce, P.L.C.

(57) ABSTRACT

Disclosed are methods for forming FinFETs using a first hard mask pattern to define active regions and a second hard mask to protect portions of the insulating regions between active regions. The resulting field insulating structure has three distinct regions distinguished by the vertical offset from a reference plane defined by the surface of the active regions. These three regions will include a lower surface found in the recessed openings resulting from the damascene etch, an intermediate surface and an upper surface on the remaining portions of the lateral field insulating regions. The general correspondence between the reference plane and the intermediate surface will tend to suppress or eliminate residual gate electrode materials from this region during formation of the gate electrodes, thereby improving the electrical isolation between adjacent active regions and improving the performance of the resulting semiconductor devices.

12 Claims, 22 Drawing Sheets

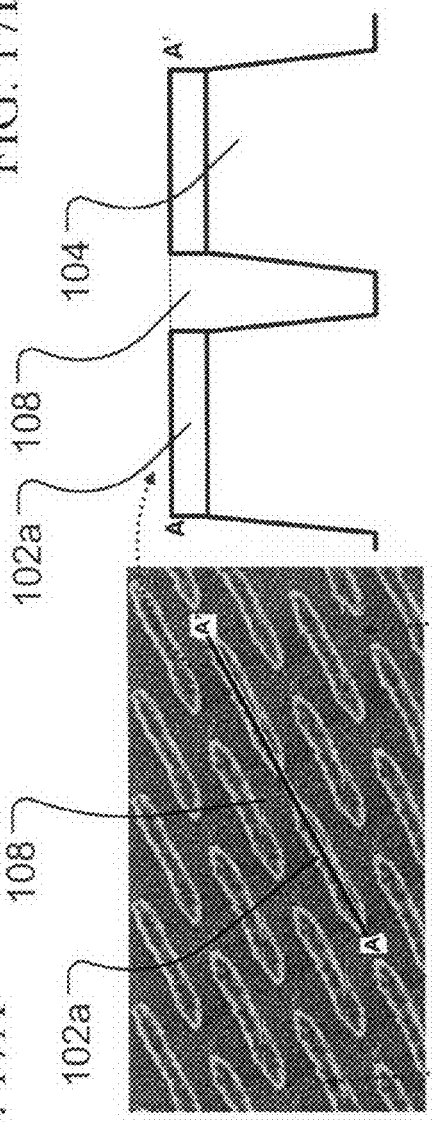
FIG. 17A
FIG. 17B
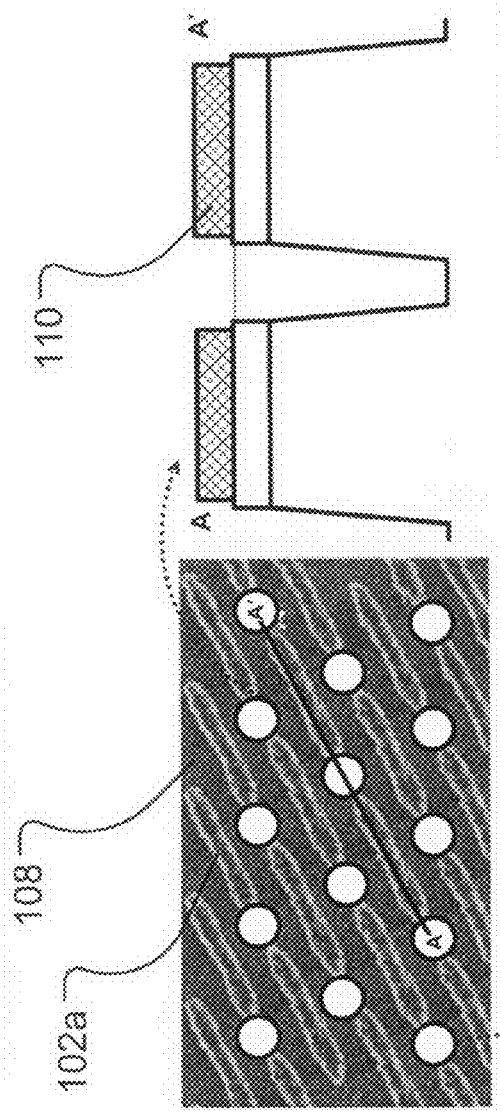
FIG. 18A
FIG. 18B

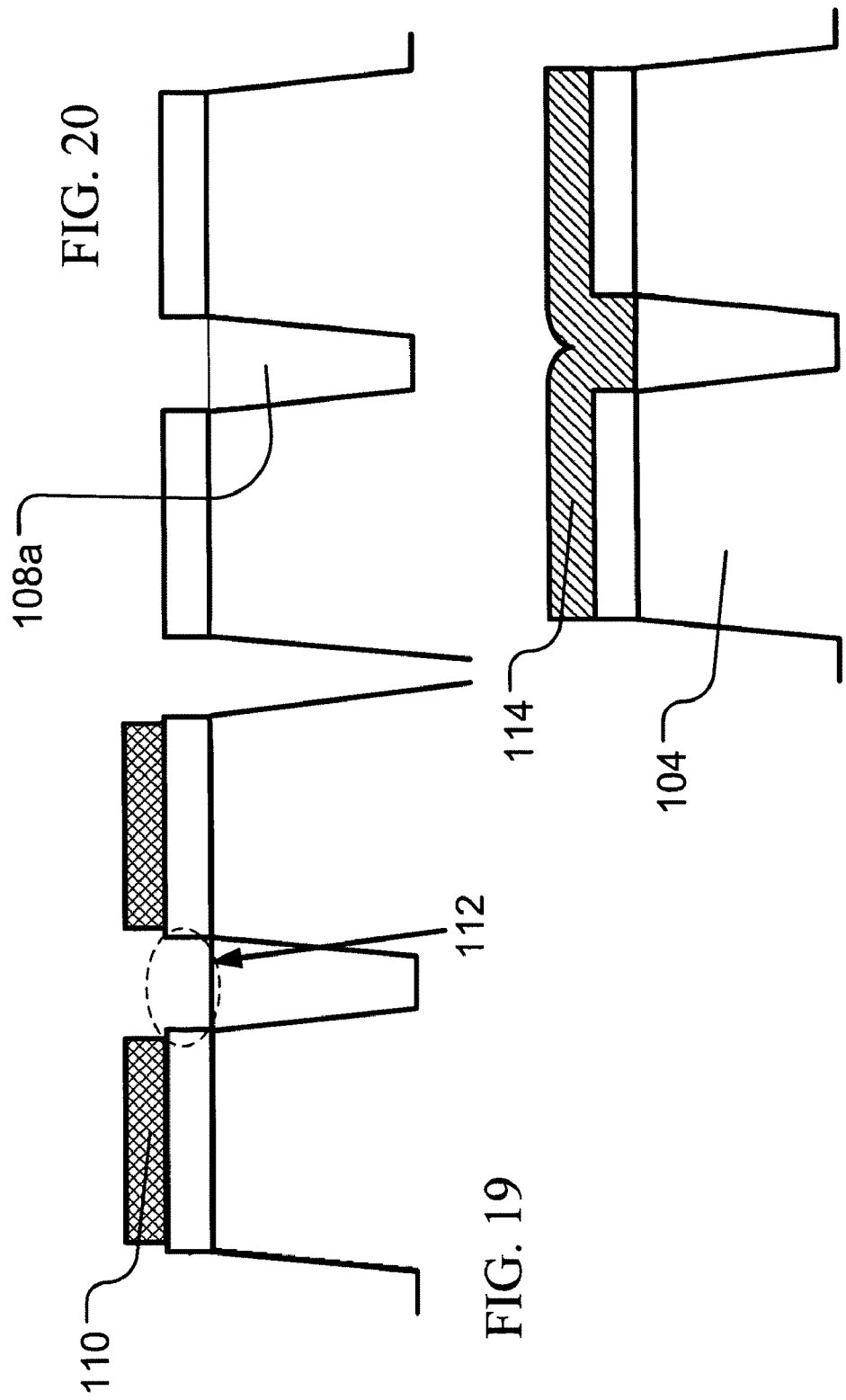

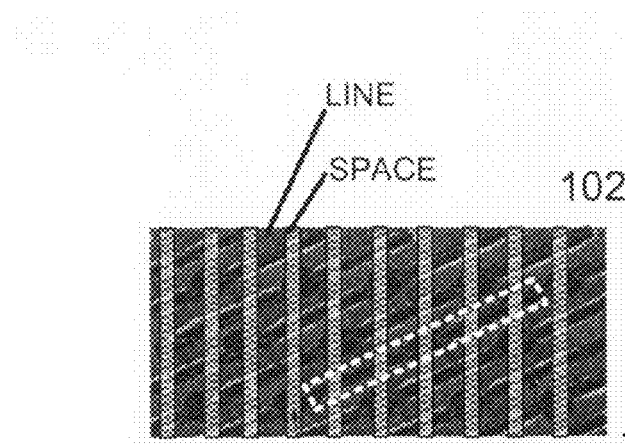
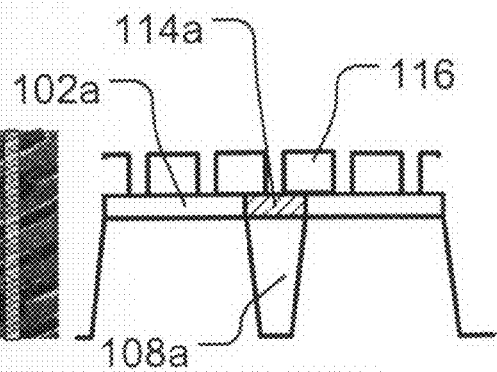
FIG. 23A  FIG. 23B
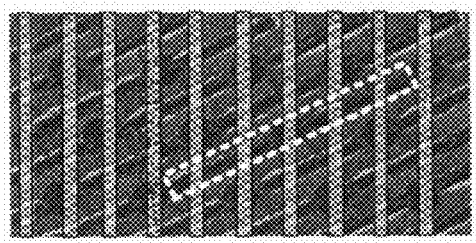
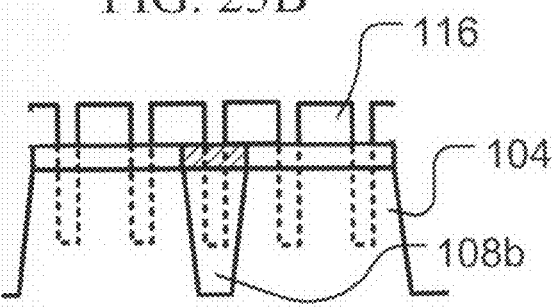
FIG. 24A  FIG. 24B
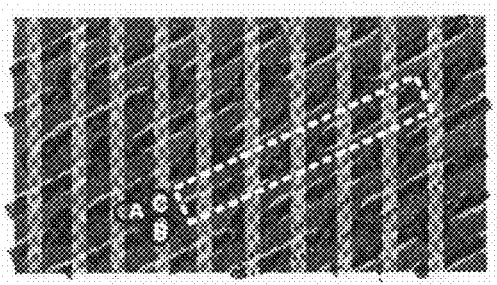
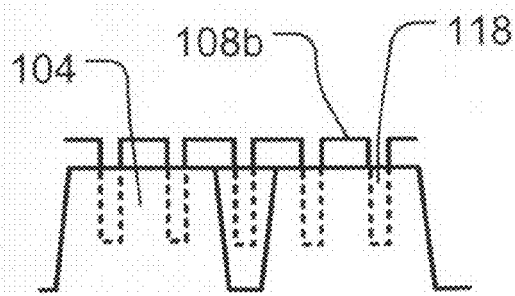
FIG. 25A  FIG. 25B

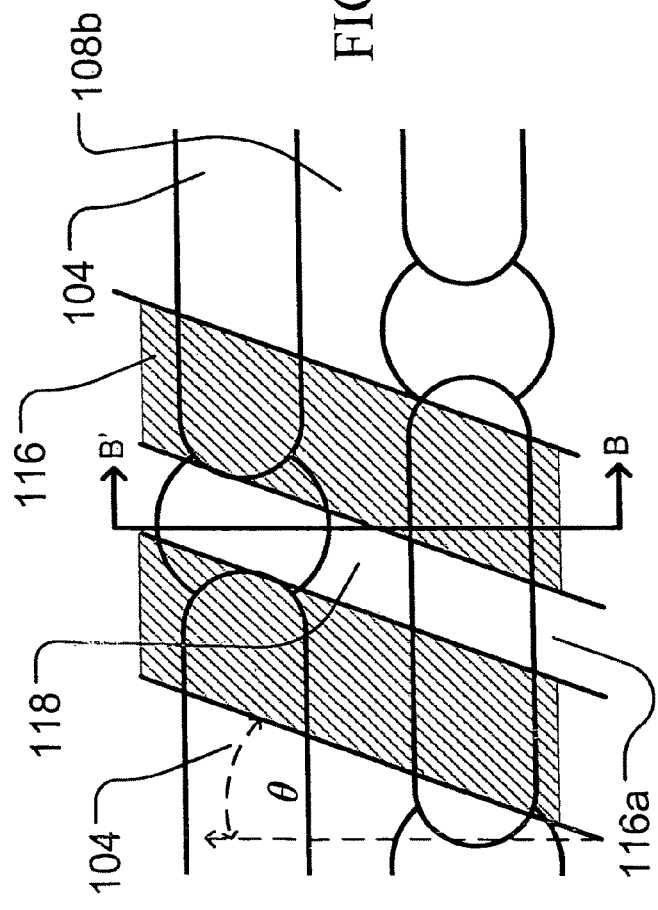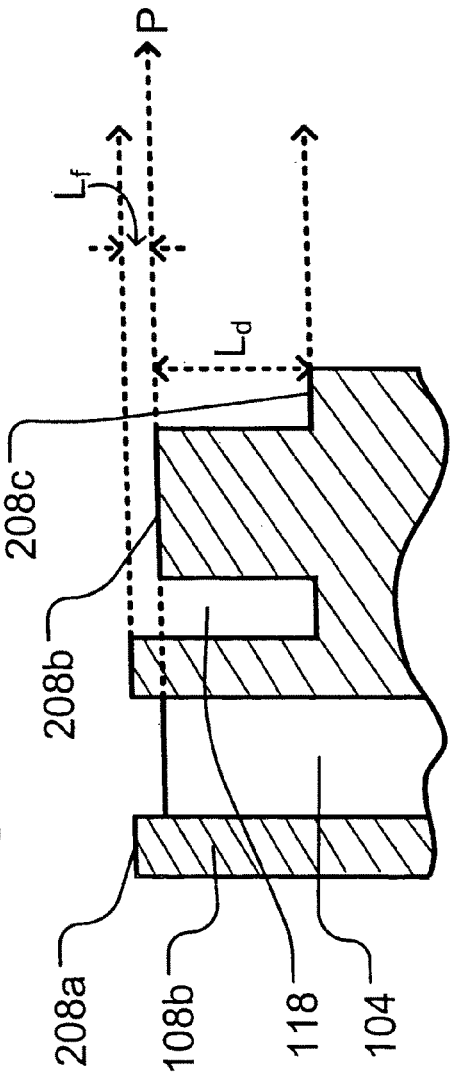

FABRICATION OF LOCAL DAMASCENE FINFETS USING CONTACT TYPE NITRIDE DAMASCENE MASK

CROSS-REFERENCE TO RELATED APPLICATIONS

This application claims priority under 35 U.S.C. §§119 and 120 to, and is a continuation application of, U.S. patent application entitled, FABRICATION OF LOCAL DAMASCENE FINFETS USING CONTACT TYPE NITRIDE DAMASCENE MASK, currently and filed Aug. 24, 2006, having Ser. No. 11/508,992 now U.S. Pat. No. 7,488,654, which claims priority to Korean Patent Application No. 10-2005-0108796, filed with the Korean Patent Office on Nov. 14, 2005, priority is hereby claimed to all of the above mentioned prior filed applications and the contents of which are all hereby incorporated herein by reference in their entirety.

BACKGROUND

1. Field of Endeavor

The example embodiments relate to methods for manufacturing semiconductor devices, and more particularly, to methods for manufacturing semiconductor devices including fin-type channel regions.

2. Related Art

As the integration density of semiconductor devices increases, the surface area available for forming conventional metal-oxide-semiconductor field effect transistor (MOSFET) is reduced correspondingly. For semiconductor devices utilizing conventional planar transistors, higher integration densities also lead to corresponding reductions in the channel lengths of the transistors utilized in such devices. The reduction in the channel lengths will tend to result in improvements in some parametric and/or operating characteristics of the resulting devices, for example, increased operating speed.

Reducing the channel length of planar transistors to levels below about 100 nm, however, also tends to degrade other parametric and/or operating characteristics of the resulting devices. One particular issue associated with short channel devices include increased leakage as a result of the decreased distance between the corresponding source and drain regions provided on opposite sides of the gate electrode. One approach for addressing these issues involves increasing the doping level of the channel regions, but, while tending to reduce leakage, the increased doping tends to degrade the active switching function of the transistor. As a result, the overall performance of the resulting MOSFET device may be severely degraded by these short channel effects (SCE) resulting, for example, in increased leakage currents and less stable and uniform sub-threshold voltages.

One approach for addressing the SCE problem in MOSFET devices involves the fabrication of a double gate field effect transistor having a non-planar channel structure with two gates formed on opposite faces of the non-planarized channel. Double gate field effect transistors fabricated in this manner tend to exhibit an improved channel control capability that is attributed, at least in part, to controlling the channel with two gates, thereby reducing the SCE problem. Further, when the voltages applied to the gate electrodes of a double gate field effect transistor are sufficient to place the transistor in an "on" state, an inversion layer will extend from each surface of the non-planar channel controlled by the gate electrodes and will tend to increase the "on" current levels, $I_{on}$, that can be achieved relative to a conventional planar transistor formed in the same surface area.

Field effect transistors have been manufactured with fin channel structures (hereinafter, referred to as finFETs) for improving certain device performance parameters in the resulting semiconductor devices. One example of a semiconductor device utilizing a finFET structure includes a double gate field effect transistor which may be fabricated using a method whereby active regions (which are also referred to, in some instances, as fin structures) are formed by etching a semiconductor substrate using a hard mask, filling the resulting recesses with an insulating material such as silicon oxide, exposing portions of the vertical and horizontal surfaces of the active regions, forming a gate dielectric film, for example, a thin oxide, on the exposed surfaces of the active regions, and forming a gate electrode on the gate dielectric film, thereby providing additional control over the threshold voltage of the resulting transistors.

Another example of a finFET device encompasses integrated circuit field effect transistor devices including a substrate that includes a primary surface and an active channel pattern formed on the primary surface. This active channel pattern may include a series of stacked channels that are spaced apart from one another to define at least one tunnel between adjacent channels. A gate electrode is then formed on the exposed surfaces of the channels, including that portion of the exposed surfaces that extend through the at least one tunnel.

Because the top surfaces and side surfaces of the fins in a finFET can be used as channel regions, finFETs can provide wider effective channel regions than conventional planar transistors that could formed in the same surface area of the substrate. Accordingly, finFETs can provide increased operation current, thereby providing improved performance relative to corresponding planar transistors and/or increased integration density while still maintaining acceptable parametric and performance characteristics.

Many conventional finFETs are fabricated using silicon-on-insulator (SOI) substrates in which the fin structures are electrically insulated from the bulk substrate bodies. Accordingly, the threshold voltage of such finFET transistors cannot be effectively controlled using body-bias, thereby complicating efforts to control the threshold voltage of the resulting CMOS transistors. However, if a conventional bulk substrate is used to allow for more effective body-bias control, the resulting increase in the extent of the drain depletion region tends to increase a junction leakage current, off current, and junction capacitance, thereby degrading the performance of the semiconductor devices. In addition, in highly integrated devices, there tend to be additional decreases in threshold voltage and corresponding increases in off current as a result of short channel effects.

Another problem associated with finFETs is high contact resistance. For example, conventional finFET structures may include bit line contacts formed across and contacting the top surfaces of the fins. However, because the bit lines contact only the narrow top surfaces of the fins, the resistance of these bit line contacts may be increased to a level that will tend to degrade the performance of the resulting devices. The configuration of the fins may be modified in order to increase the area available for forming the bit line contacts and reduce the contact resistance. Reconfiguring the fin structure to provide additional contact area, however, tends to increase the complexity of the semiconductor device fabrication and/or reduce the degree of integration density that can be achieved, thereby increasing costs and tending to suppress yield.

According to some conventional teachings, the sizing of the source and drain regions in contact with fins may be increased to provide greater contact area. However, as the distance between the fins is increased to accommodate the enlarged source and drain regions, the overall degree of integration that can be achieved in the resulting finFET device will be reduced.

Another problem associated with fabricating finFETs is damage to and/or collapse of the thin fins protruding from a substrate. The likelihood of such damage or collapse increases as the widths of the fins is reduced. For example, elongated fins projecting from the substrate according to conventional processes are not initially provided with any supporting or reinforcing structures. Accordingly, forming the fins in such a manner results in fin structures exhibiting increased susceptibility to mechanical damage and which may result in the collapse or damage to the fin structures during subsequent fabricating processes.

SUMMARY

Example embodiments include methods of fabricating semiconductor devices that provide for improved removal of the gate electrode material, particularly in those regions separating adjacent fins in a longitudinal direction, thereby allowing for reduced overetching and/or reduced defects during gate electrode formation. The methods according to the example embodiments of may be used to fabricate finFETs on a variety of substrates including, for example, both silicon on insulator (SOI) substrates or semiconductor substrates that may provide improved body-bias control, exhibit improved operating current and reduced contact resistance.

Example embodiments further include methods in which a plurality of active regions are separated by a field insulating material, wherein the active regions are arranged along a plurality of parallel longitudinal axes with the active regions arranged along a single longitudinal axis being offset in a longitudinal direction relative to active regions arranged along an adjacent longitudinal axis, wherein each active region is separated from adjacent active regions arranged along the same axis by a specific field insulating region and is separated from adjacent active regions arranged along each adjacent axis by a lateral field insulating region; providing a hard mask pattern of a first hard mask material on the active regions; forming a pattern that exposes the specific field insulating regions; removing field insulating material from the exposed specific field insulating regions to form openings in the field insulating material; removing the pattern; depositing a second hard mask material layer to fill the openings; removing an upper portion of the second hard mask material to planarize the surface and expose an upper surface of the lateral field insulating regions; forming a damascene pattern at an angle from 10 to 90 degrees relative to the parallel longitudinal axes that exposes portions of the upper surface of the lateral field insulating regions; removing field insulating material from the exposed portions of the lateral field insulating regions to form recessed gate openings separated by remaining portions of the lateral field insulating regions; removing the damascene pattern; removing the first and second hard mask materials to expose three field insulating material surfaces with a lower surface found in the recessed gate openings, an intermediate surface found in the specific field insulating regions and an upper surface found in remaining portions of the lateral field insulating regions; forming a gate dielectric on an exposed surface of the active regions; depositing a gate electrode material layer; and patterning and etching the gate electrode material to form separate gate electrode structures.

The offset in the longitudinal direction will typically correspond to a percentage of the length of a single active region depending on, for example, the operative design rules, the configuration of the active regions and the longitudinal and/or lateral pitch between adjacent active regions. In most instances, it is anticipated that the offset in the longitudinal direction will fall between 25% and 75%, for example, 33% or 50%, so that the active regions in every other or every third row will be aligned. As a result, a group of gate electrodes extending across a single active region will not all extend across the closest active regions in the adjacent rows. i.e., the active regions aligned with the parallel longitudinal axes on either side of the subject active region.

Example embodiments of the methods may further include active regions having a major dimension and a minor dimension, a ratio of the major dimension to the minor dimension being at least 2:1, active regions having generally elliptical configuration and having a major dimension from 100 to 300 nm, active regions having a generally elliptical configuration and having a major dimension from 160 to 200 nm and a minor dimension from 10 to 60 nm.

Example embodiments of the methods may further include using silicon nitride as the first hard mask material with the hard mask pattern of the first hard mask material being formed on the surface of a semiconductor material to protect active regions and expose field regions of the substrate; removing the semiconductor material from the field regions to form field openings surrounding projecting semiconductor structures; filling the field openings with an insulating material; and then removing an upper portion of the insulating material to planarize the surface and expose an upper surface of the hard mask pattern.

Example embodiments of the methods may further include forming a pad layer between the surface of the semiconductor material and the first hard mask material. The pad layer, if utilized, may be formed from semiconductor oxide layer having a thickness from 10 Å to 150 Å. The first hard mask material may be silicon nitride having a thickness $T_{m1}$ from 100 Å to 700 Å; and the second hard mask material may have a thickness $T_{m2}$ from 100 Å to 700 Å. The material used to form the gate electrode may, for example, include sufficient levels of one or more p-type dopants to increase the work function by at least 0.5 V relative to undoped or conventional n-type gate electrode materials. The field openings formed in the lateral field insulating regions during the damascene etch will typically have a depth of at least 1000 Å below a reference plane defined by upper surfaces of the active areas, but will be less than the depth of the field insulating material in those regions.

Example embodiments of the methods may further include filling the field openings with an insulating material by forming an oxide layer on exposed surfaces of the projecting semiconductor structures; forming a silicon nitride layer on the oxide layer; and depositing sufficient thickness of at least one oxide material on the silicon nitride layer to fill the field openings completely.

Example embodiments of the methods may further include selecting the second hard mask material from a group consisting of silicon nitride, silicon oxynitride and polysilicon. The second hard mask material is selected for its ability to resist the etch chemistry or chemistries utilized in removing the insulating material in the lateral field insulating regions, thereby protecting the specific field insulating regions separating adjacent ones of the active regions aligned along their longitudinal axes.

As a result of processing the semiconductor substrates in the manner described above, the resulting finFET structure will exhibit three different field insulating material surfaces that are offset in a vertical direction from a reference plane defined by the surfaces of the active regions in which the field insulating material surface in the recessed gate openings is at least 500 Å below the reference plane, the field insulating material surface in the specific field insulating regions is offset by less than 400 Å from the reference plane, and the field insulating surface of the remaining portions of the lateral field insulating regions will lie above the reference plane. For instance, example embodiments will include finFET structures in which the field insulating material surfaces in the gate recesses is from 500 to 2000 Å below the reference plane, the field insulating material surface in the specific field insulating regions is offset by less than 400 Å from the reference plane, and the field insulating surface of the remaining portions of the lateral field insulating regions is at least 300 Å above the surface of the specific field insulating regions.

Example embodiments of the structures fabricated according to the disclosed methods may further include structures in which the field insulating material surfaces in the gate recesses is from 500 to 2000 Å below the reference plane, the field insulating material surface in the specific field insulating regions is offset by less than 100 Å from the reference plane, and the field insulating surface of the remaining portions of the lateral field insulating regions is at least 300 Å above the surface of the specific field insulating regions.

Example embodiments of the methods may further include defining a plurality of elongated active regions surrounded by a field insulating material, wherein the active regions are arranged along a parallel longitudinal axis with each active region is separated from adjacent active regions by a specific field insulating region and surrounded by a lateral field insulating region; providing a hard mask pattern of a first hard mask material on the active regions; forming a pattern that exposes the specific field insulating regions; removing field insulating material from the exposed specific field insulating regions to form openings in the field insulating material; removing the pattern; depositing a second hard mask material layer to fill the openings; removing an upper portion of the second hard mask material to planarize the surface and expose an upper surface of the lateral field insulating regions; forming a damascene pattern at an angle of 10 to 90 degrees to the parallel longitudinal axes along which the active regions are aligned to expose portions of the upper surface of the lateral field insulating regions; removing field insulating material from the exposed portions of the lateral field insulating regions to form gate recesses separated by remaining portions of the lateral field insulating regions; removing the damascene pattern; removing the first and second hard mask materials to expose three field insulating material surfaces with a lower surface found in the gate recesses, an intermediate surface found in the specific field insulating regions and an upper surface found in remaining portions of the lateral field insulating regions; forming a gate dielectric on exposed surfaces of the active region; depositing a gate electrode material layer; and patterning and etching the gate electrode material to form separate gate electrode structures.

BRIEF DESCRIPTION OF THE DRAWINGS

Example embodiments of the methods that may be utilized in fabricating the disclosed fin structures and semiconductor devices incorporating such structures are addressed more fully below with reference to the attached drawings in which:

FIGS. 1A through 16A are perspective views illustrating a method of fabricating a semiconductor device according to an example embodiment;

FIGS. 1B through 16B are cross-sectional views along a plane B-B along the longitudinal axis of a series of active regions as shown in FIGS. 1A through 16A illustrating a method of fabricating a semiconductor device according to an example embodiment;

FIGS. 10C through 16C are cross-sectional views along a plane C-C along the longitudinal axis of a lateral field insulating region as shown in FIGS. 10A through 16A illustrating a method of fabricating a semiconductor device according to an example embodiment;

FIGS. 17A, 18A and 22A through 25A are plan views of a series of active regions illustrating a method of fabricating a semiconductor device according to an example embodiment;

FIGS. 17B, 18B and 22B through 25B are cross-sectional views along a line A-A' as shown in FIGS. 17A, 18A and 22A through 25A taken along two adjacent active areas separated by a single specific field region illustrating a method of fabricating a semiconductor device according to an example embodiment;

FIGS. 19 through 21 are cross-sectional views illustrating steps of a method of fabricating a semiconductor device according to an example embodiment intermediate those steps illustrated in FIGS. 18B and 22A;

FIG. 26A is a plan view of a damascene region of a semiconductor device structure fabricated according to an example embodiment;

FIG. 26B is a cross-sectional view through the structure illustrated in FIG. 26A taken along line B'-B.

Figure 1A:
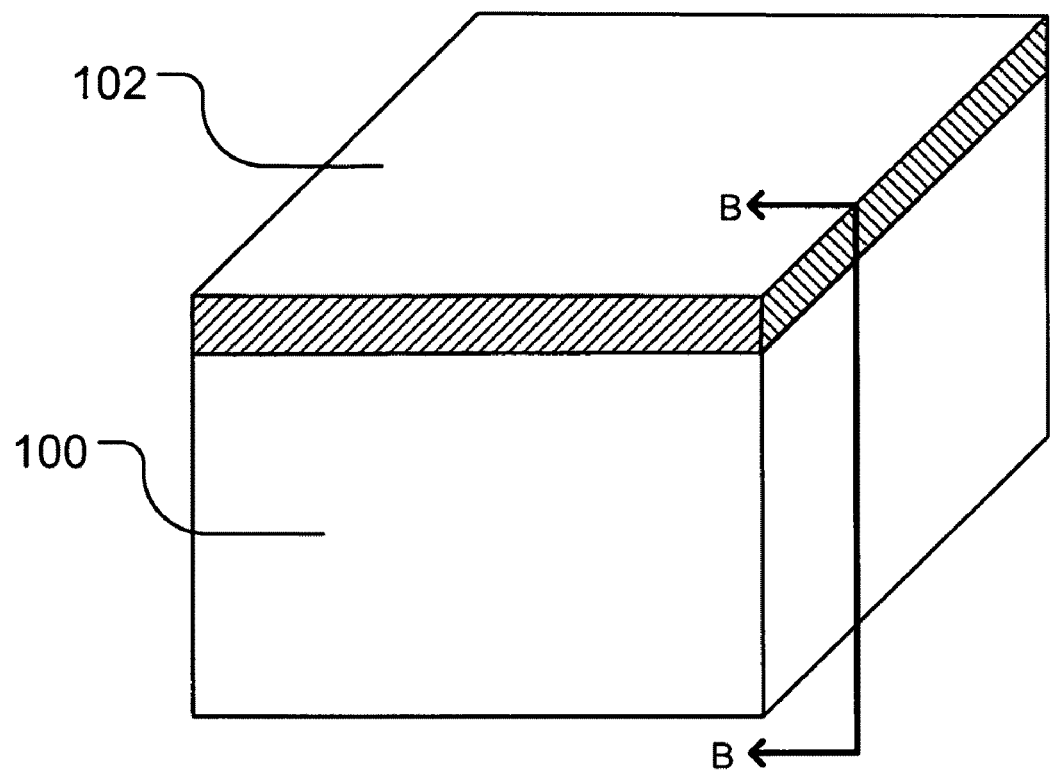

It should be noted that these Figures are intended to illustrate the general characteristics of methods and materials of certain example embodiments to supplement the written description provided below. These drawings are not, however, to scale, may not precisely reflect the characteristics of any given embodiment, and should not be interpreted as defining or limiting the range of values or properties of embodiments within the scope of the claims. In particular, the relative thicknesses and positioning of layers or regions may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described more fully with reference to the accompanying drawings, in which example structures and process steps for fabricating such structures are shown. As will be appreciated by those skilled in the art, the associated figures are illustrative only and that other embodiments may take many different forms. The following claims, therefore, should not be construed as limited to the example embodiments. These example embodiments are provided so that this disclosure will be thorough and complete and thereby fully convey the concepts embodied by the examples to those skilled in the art. Indeed, other related embodiments may be and likely will be apparent to those of ordinary skill in the art based on the teachings provided in this disclosure in light of conventional knowledge in the art and are meant to be included to the extent consistent with the example embodiments detailed herein.

It will be understood that, although the terms first, second, etc., may be used herein to describe various elements, these ordinal designations are used only to distinguish more clearly between the elements and should not be read as limiting these terms. For example, merely redesignating a "first" element as a "second" element would not constitute any material or substantive change in the referenced structure or depart in any fashion from the scope of example embodiments disclosed herein. Further, as used herein, the term "and/or" indicates that any and all combinations of one or more of the associated listed items may be utilized.

It will be understood that when an element is referred to as being "on" or "adjacent" another element, intervening structure may be present, for example, active regions are referred to as "adjacent" although separated by field insulating regions, which may, in turn, comprise a composite structure of several insulating materials. In contrast, when an element is referred to as being "directly on" or "directly adjacent" another element, this language should be understood to indicate that no intervening elements are present.

The terminology used herein is for the purpose of describing particular example embodiments only and is not intended to be limiting of example embodiments of the invention. As used herein, the singular forms "a", "an" and "the" should generally be interpreted to include the plural forms as well, unless the context clearly indicates that such a plural interpretation would be clearly unreasonable. It will be further understood that the terms "comprises," "comprising," "includes" and/or "including," when used herein, specifies the presence of the recited features, integers, steps, operations, elements, components and/or groups, but does not preclude the presence or addition of one or more other features, integers, steps, operations, elements, components, and/or groups thereof.

It should also be noted that in some alternative implementations, the functions/acts noted may occur out of the order reflected in the attached FIGURES or described in the corresponding text. For example, the structural changes reflected in two successive FIGURES may in fact be executed substantially concurrently, may sometimes be executed in the reverse order, and/or may not reflect intervening steps depending upon the functionality/acts involved and the context of the corresponding description.

A semiconductor device according to the example embodiments may be a field effect transistor having a fin structure (hereinafter, referred to as finFET) in which the fin is used as a channel region and/or forms a portion of a memory device cell. The memory device may be a random access memory, for example, a dynamic random access memory (DRAM), a phase change random access memory (PRAM), a resistance random access memory (RRAM), a ferroelectric random access memory (FeRAM), and/or a NOR type flash memory, or any other semiconductor device that can utilized a finFET construction.

Figure 1B:
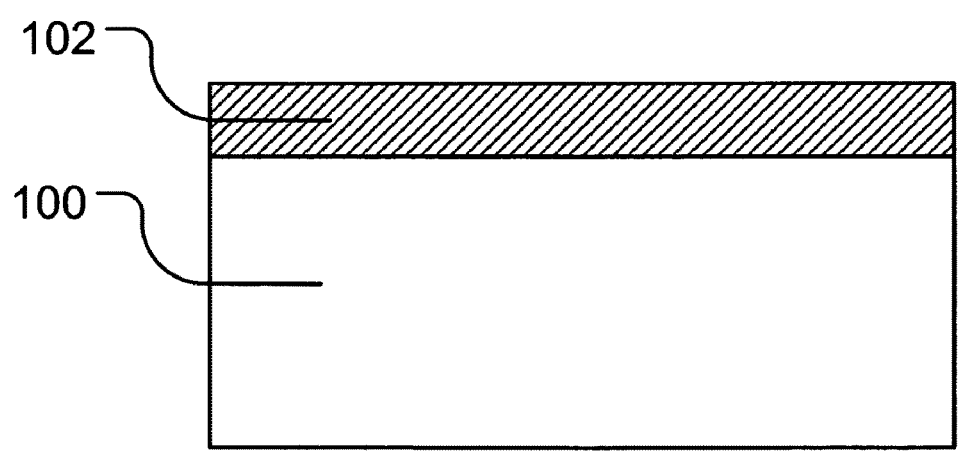
Figure 2A:
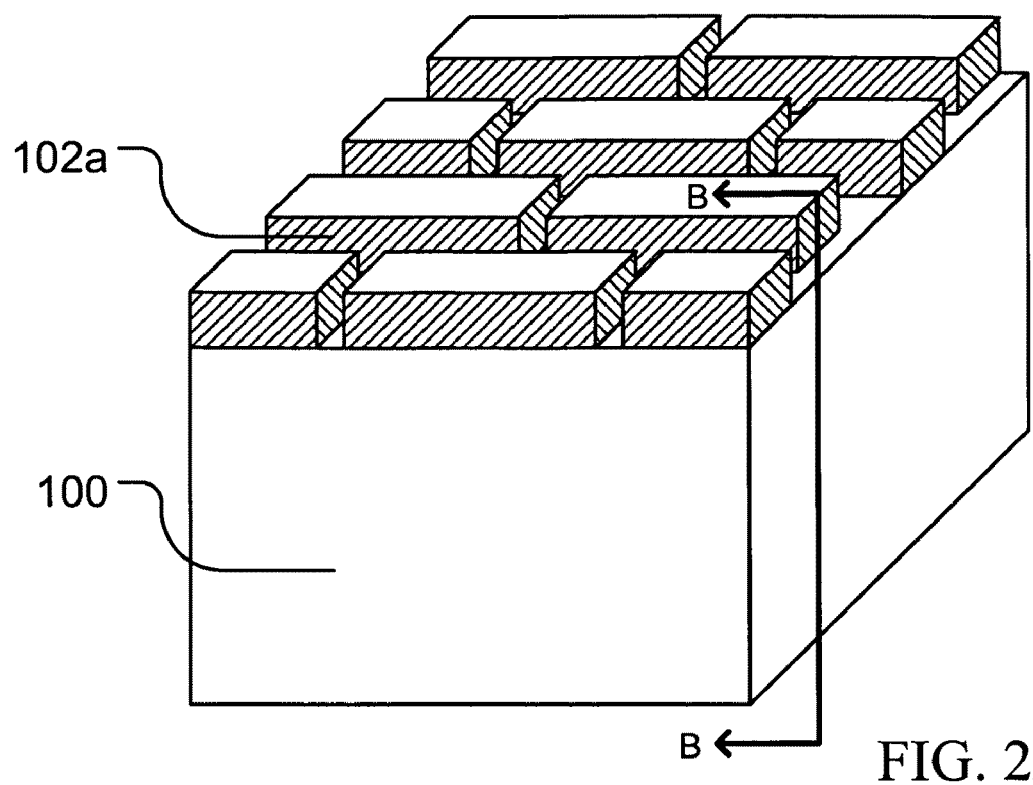
Figure 2B:
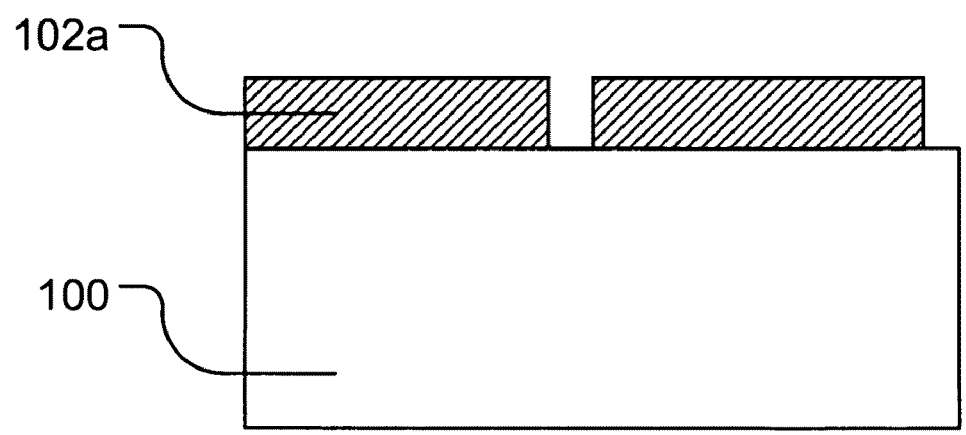
Figure 3A:
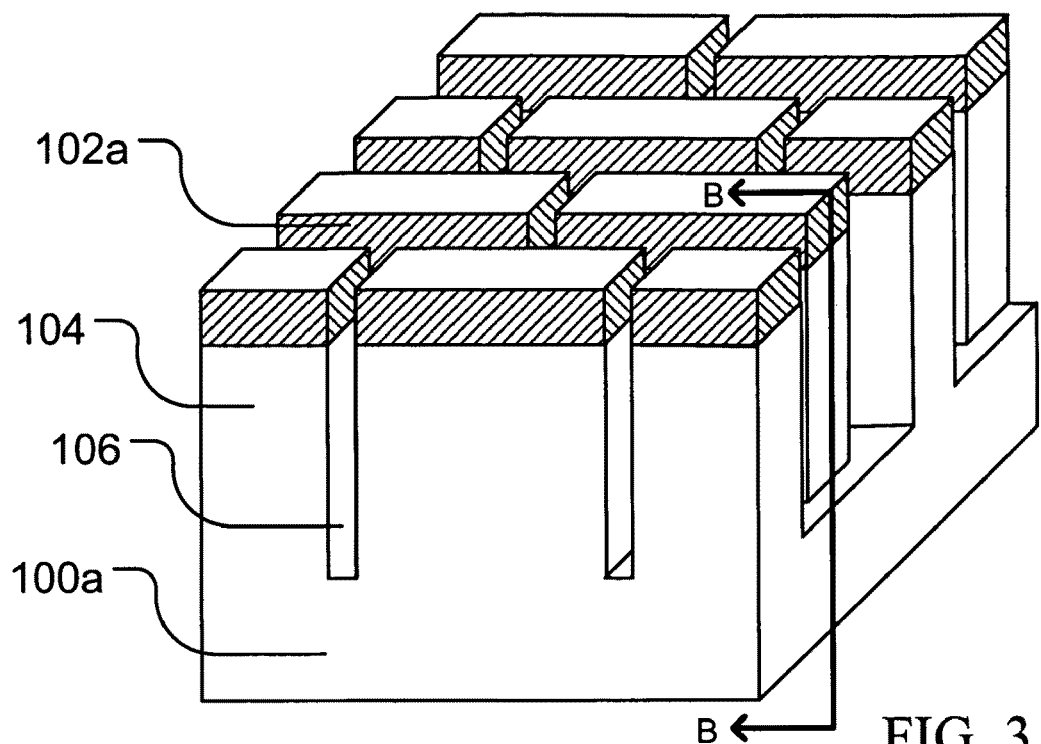
Figure 3B:
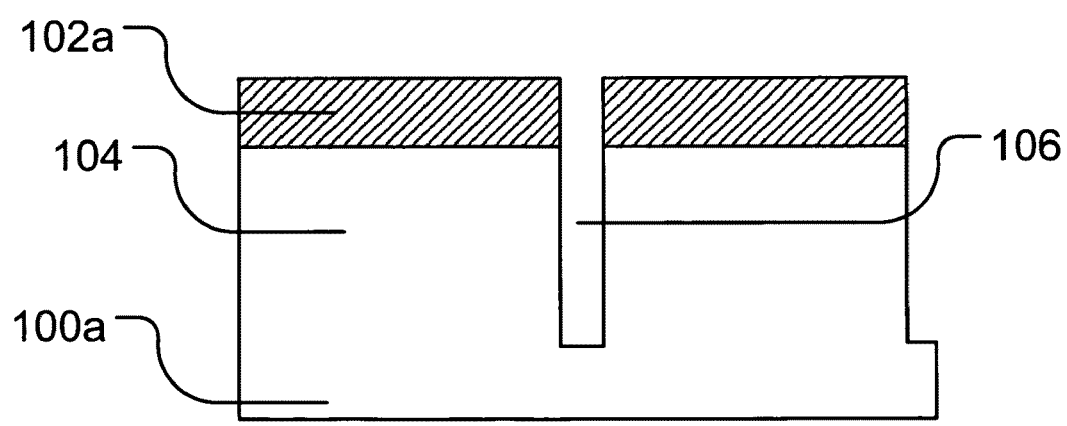

As illustrated in FIGS. 1A and 1B, a layer of a hard mask material 102, for example, silicon nitride, is formed on the surface of a semiconductor substrate 100. As illustrated in FIGS. 2A and 2B, the layer of hard mask material is then patterned using, for example, a conventional photolithographic process, and then etched to remove the exposed portions, typically using a suitable plasma etch process, to form a first hard mask pattern 102a. As illustrated in FIGS. 3A and 3B, this hard mask pattern 102a, is then used as an etch mask for removing upper portions of the semiconductor substrate 100 to define elongated active regions 104 projecting or extending upwardly from the residual portion of the semiconductor substrate 100a. After the etch is completed, each of the active regions 104 will be separated from adjacent active regions by recessed regions 106.

Figure 4A:
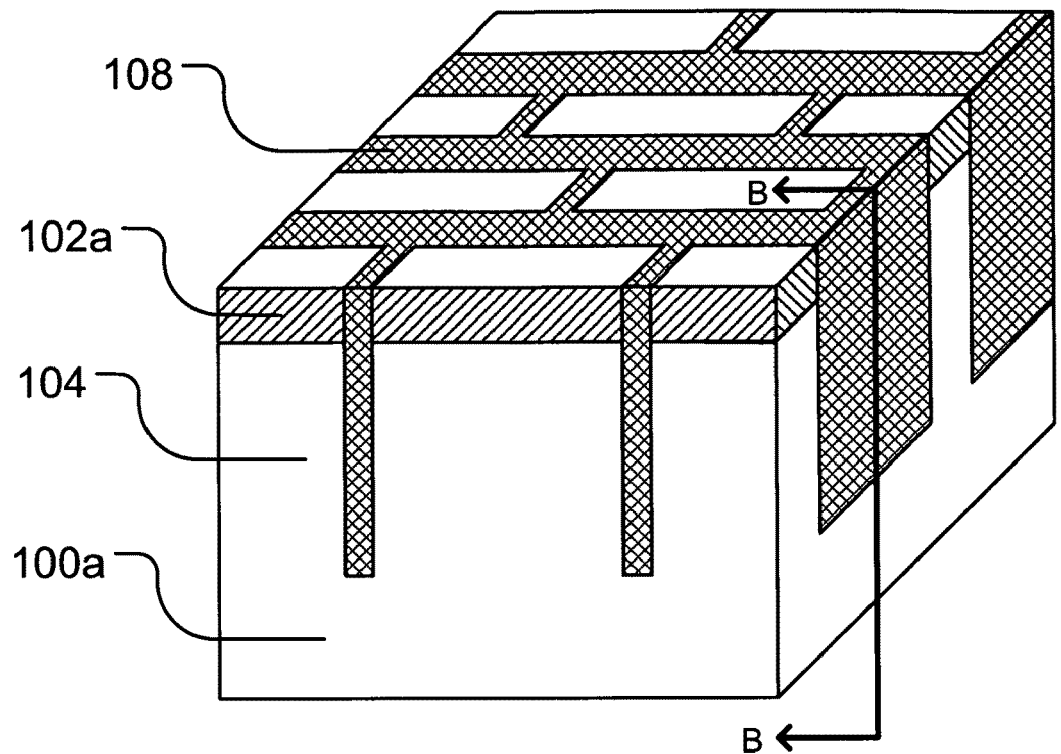
Figure 4B:
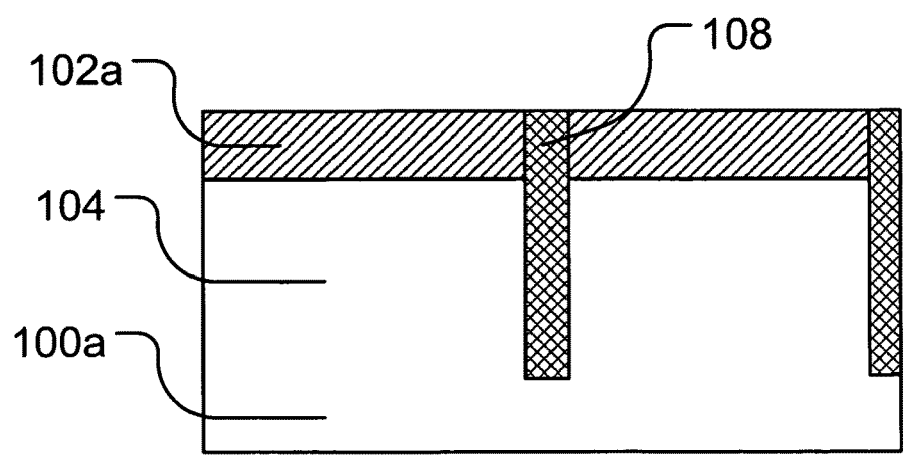

As illustrated in FIGS. 4A and 4B, the recessed regions 106 are then filled with an insulating material or a series of insulating materials to form field regions 108 separating and electrically insulating adjacent active regions 104. An upper portion of the field regions 108 is then removed, using, for example, a chemical mechanical planarization (CMP) process to expose an upper surface of the active regions 104 and to form a planarized surface suitable for subsequent processing. Accordingly, the surface of the resulting structure includes a pattern of active regions 104 with each active region surrounded by field insulating region 108.

Figure 5A:
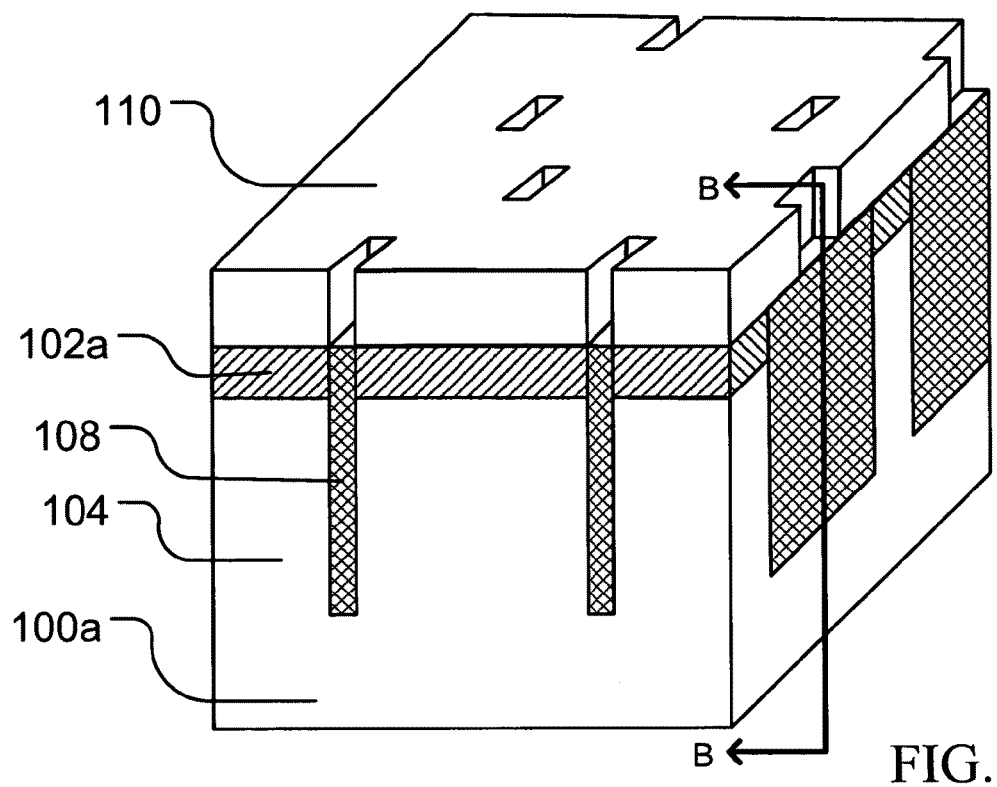
Figure 5B:
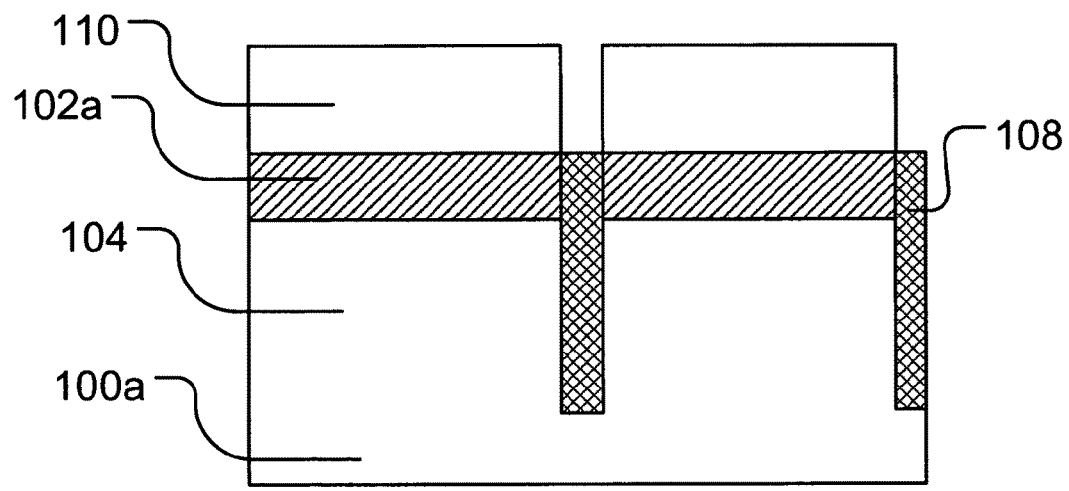

As illustrated in FIGS. 5A and 5B, a contact-type mask pattern 110 is then formed on the surface of the active regions 104 and the field insulating region 108. The contact-type mask pattern 110 includes a pattern of openings that expose a series of regions on the surface of the field insulating region 108, i.e., specific field insulating regions. The specific field insulating regions are those regions of the field insulating region 108 that lie between adjacent active regions 104 that are aligned along a common longitudinal axis, as opposed to the lateral field insulating regions that lie between adjacent active regions 104 that are aligned along separate, but parallel, longitudinal axes.

Figure 6A:
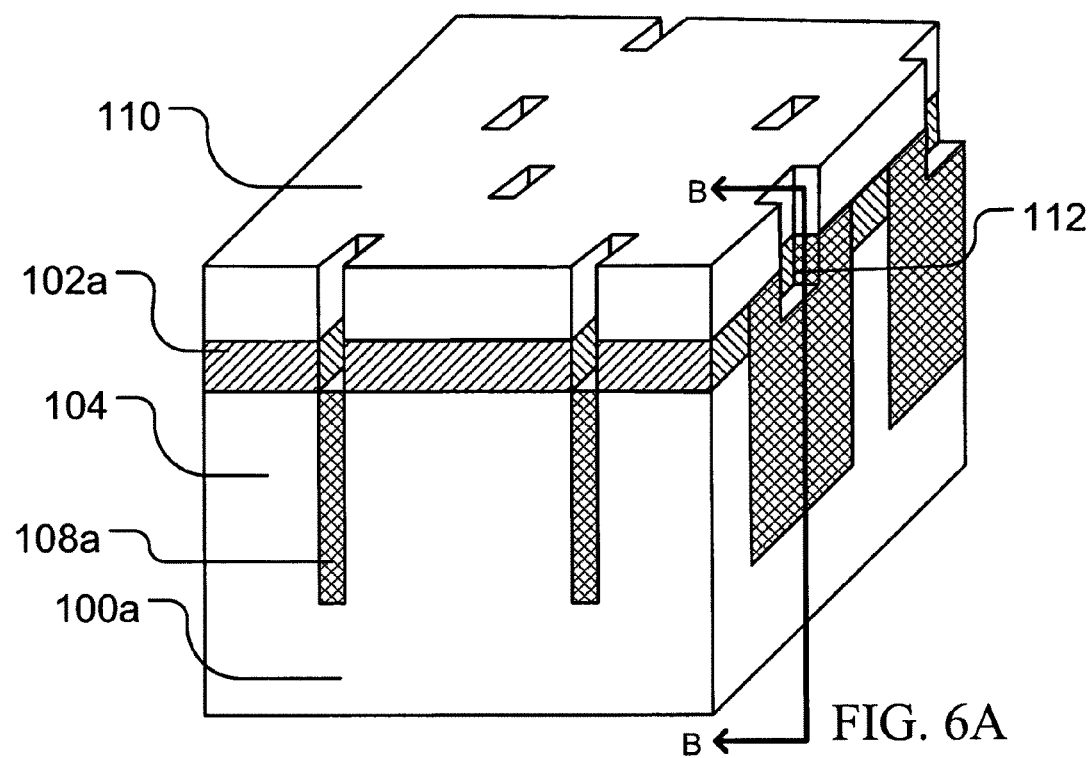
Figure 6B:
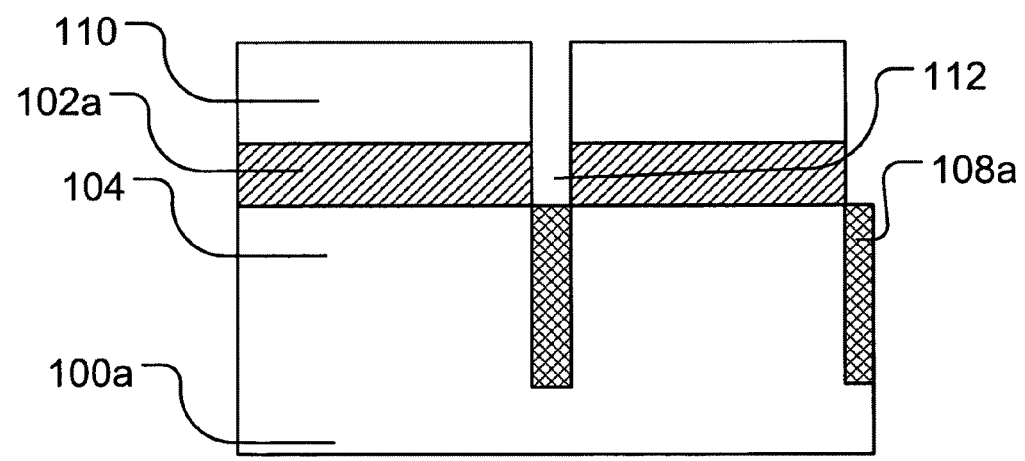
Figure 7A:
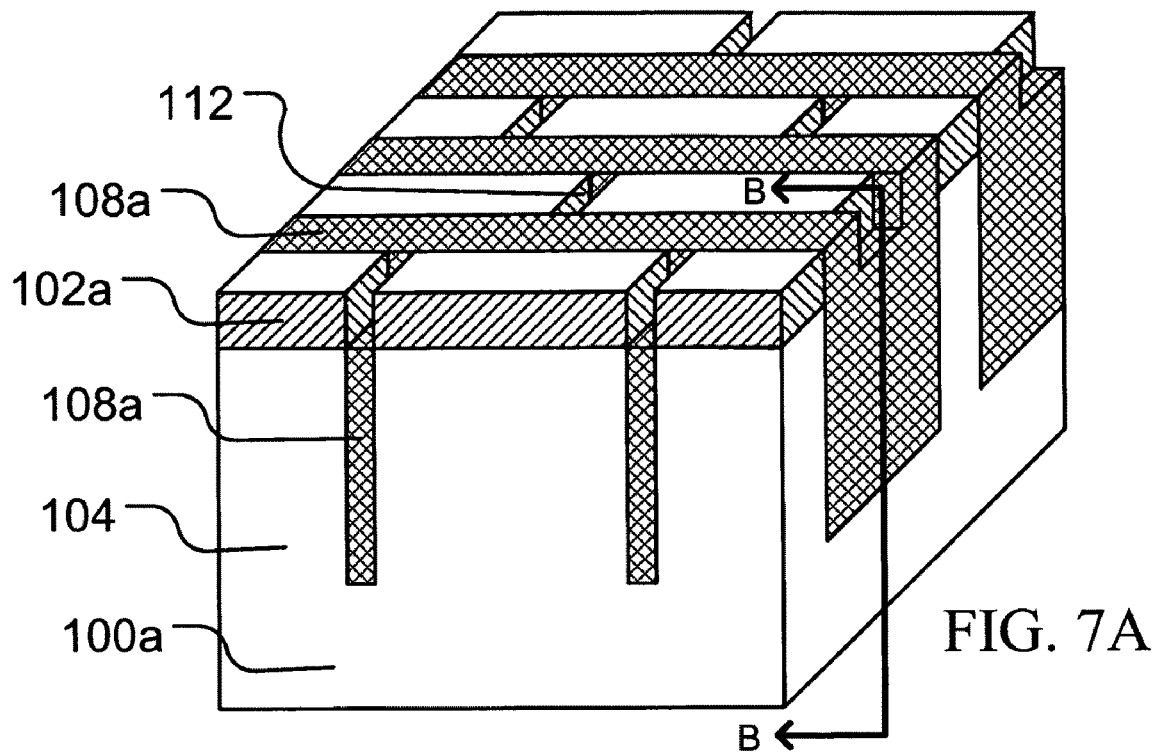
Figure 7B:
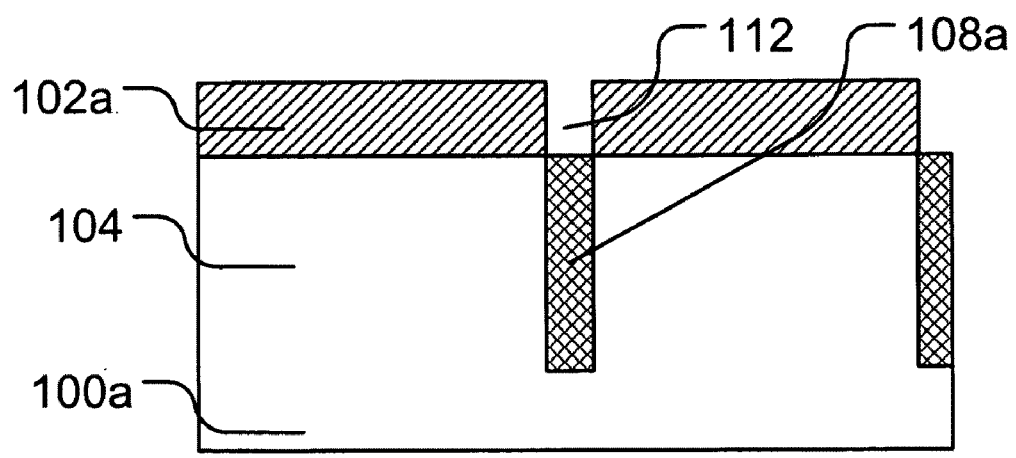

As illustrated in FIGS. 6A and 6B, using the contact-type mask pattern 110, an upper portion of the field insulating region 108 is removed from the specific field insulating regions to form a pattern of recessed regions 112 in the residual portion of the field insulating region 108a. Although this recessed region 112 is illustrated as having a depth generally equivalent to the remaining thickness of the first hard mask pattern 102a, as will be appreciated by those skilled in the art, the depth of this recess may be somewhat greater or smaller than the thickness of the first hard mask pattern depending on a number of factors including, for example, the materials used, the etch chemistry utilized, the selectivity of the etch to the exposed materials, and the amount of overetch, if any, used to ensure sufficient removal depth across the entire semiconductor substrate and/or account for loading issues as additional surfaces are exposed. It is expected that in most instances the depth of the recessed region 112 will be within about ±300 Å of the thickness of the first hard mask pattern 102a, although in some processes, greater deviations may be acceptable or smaller deviations may be preferred. As illustrated in FIGS. 7A and 7B, the contact-type pattern 110 is then removed and the substrate prepared for additional processing.

Figure 8A:
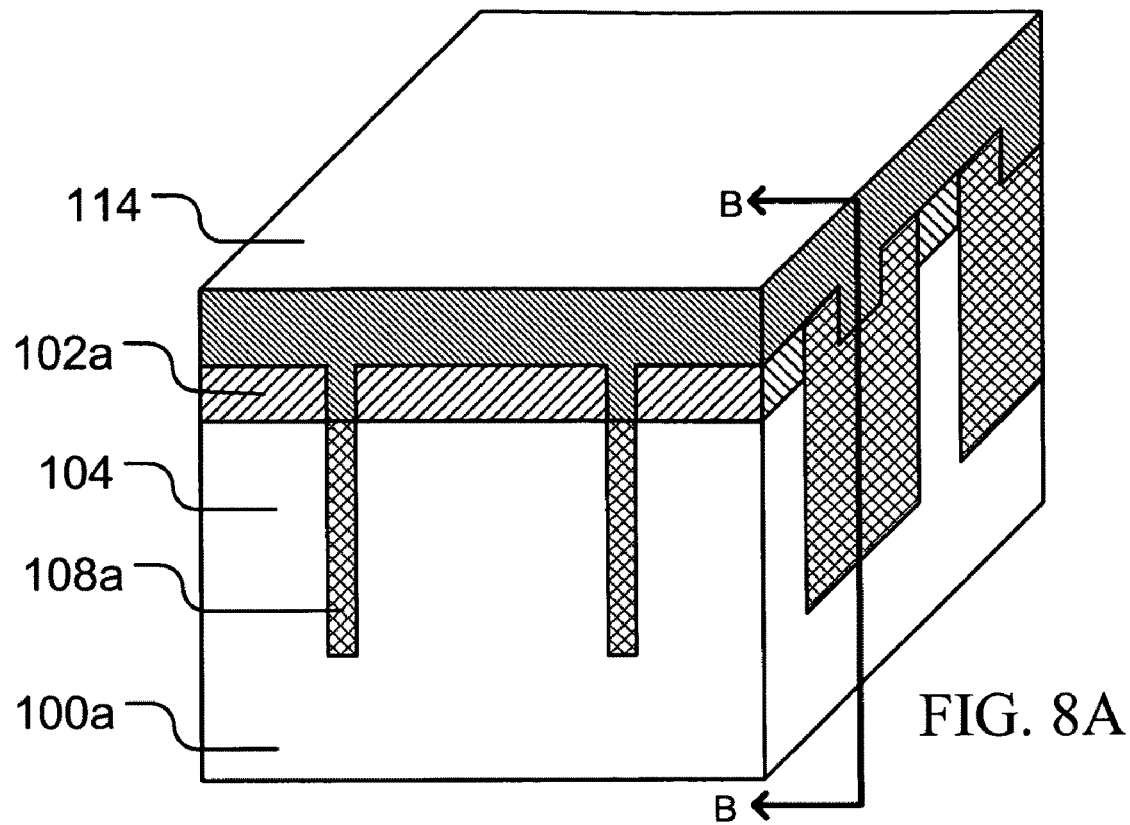
Figure 8B:
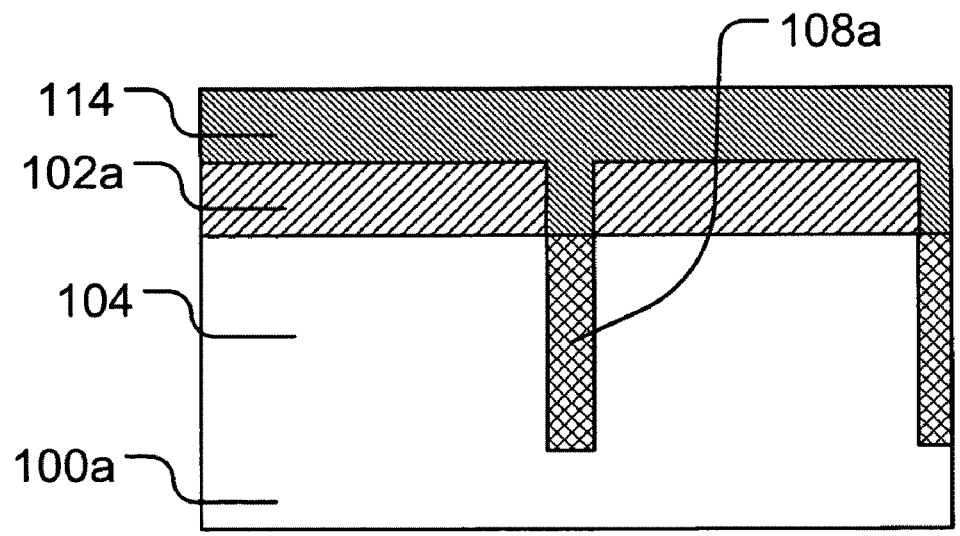
Figure 9A:
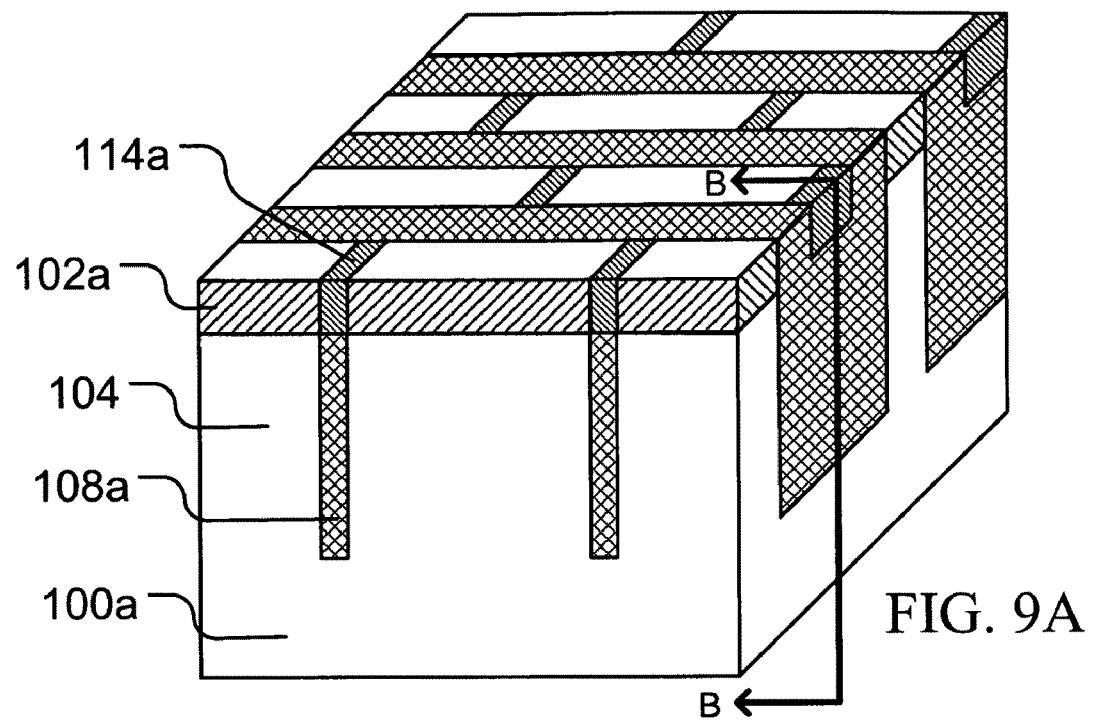
Figure 9B:
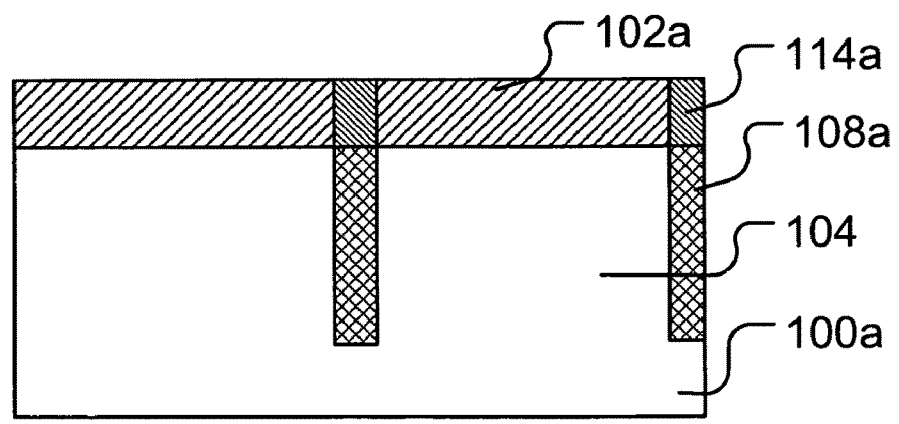

As illustrated in FIGS. 8A and 8B, a layer of at least one second hard mask material 114 is then deposited on the surface of the structure illustrated in FIG. 7A to a depth sufficient to fill the recessed regions 112 with the second hard mask material(s). The second hard mask material will typically be selected for its compatibility with the first hard mask material, for example, providing similar etch resistance to the damascene etch chemistry that will subsequently be used for removing portions of the field insulating regions 108a, and may be the same material used for forming the first hard mask. As illustrated in FIGS. 9A and 9B, an upper portion of the second hard mask material is then removed to form a second hard mask pattern 114a consisting of those portions of the second hard mask material 114 that filled the recessed regions 112, expose an upper surface of the first hard mask pattern 102a and expose an upper surface of the remaining portions of the field insulating region 108a. The upper portion of the second hard mask material may be removed using a CMP process and thereby provide a planarized surface for subsequent processing.

Figure 10A:
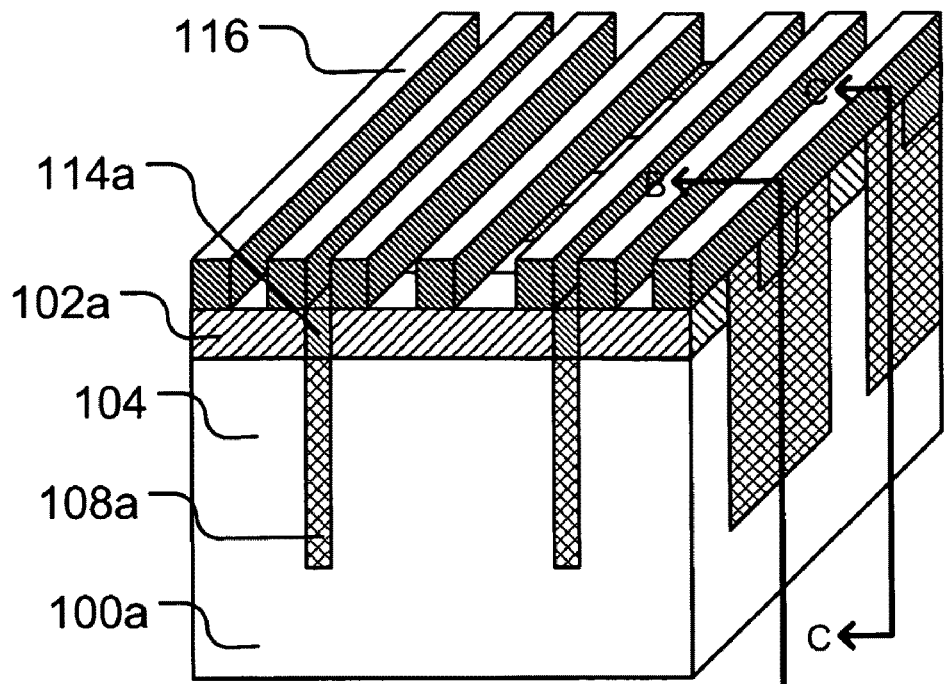
Figure 10B:
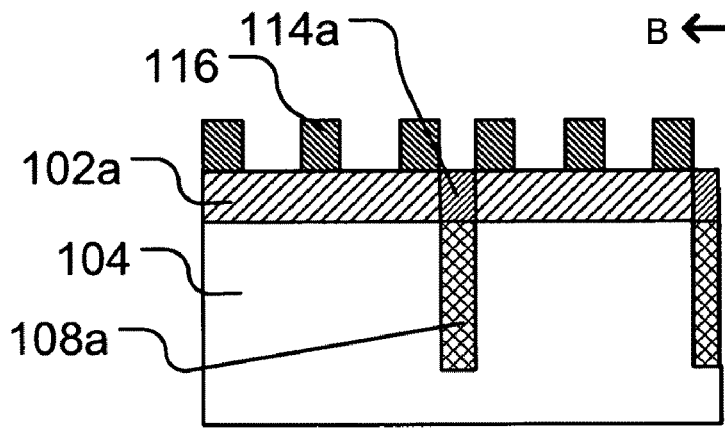
Figure 10C:
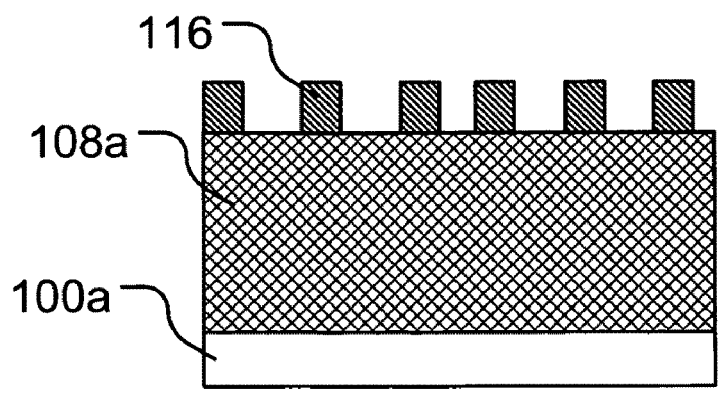
Figure 11A:
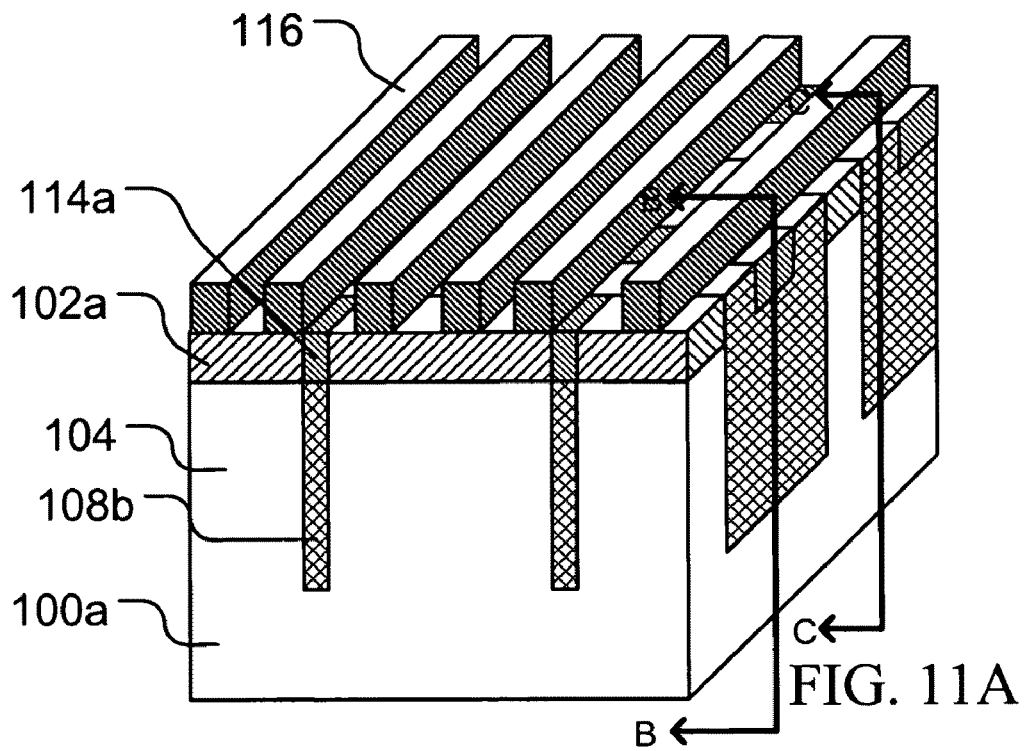
Figure 11B:
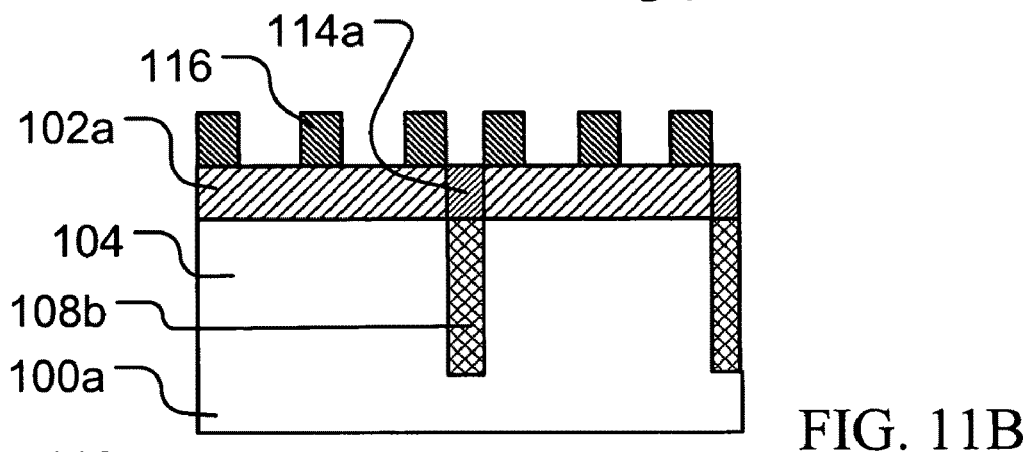
Figure 11C:
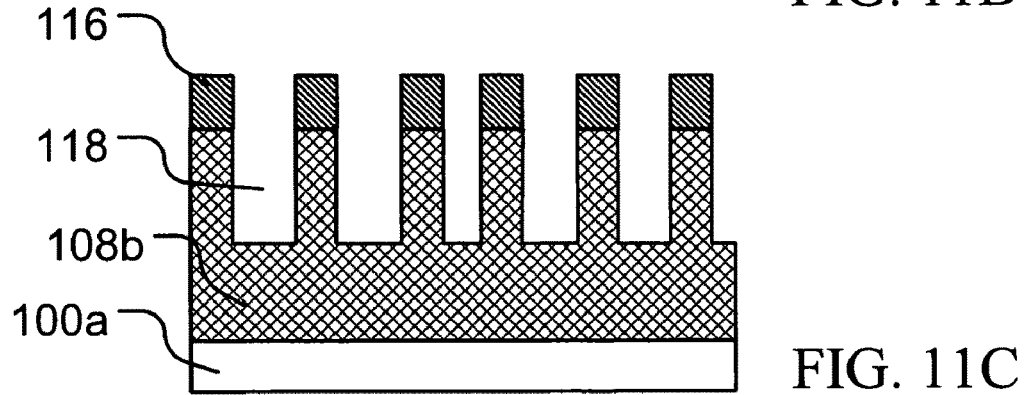
Figure 12A:
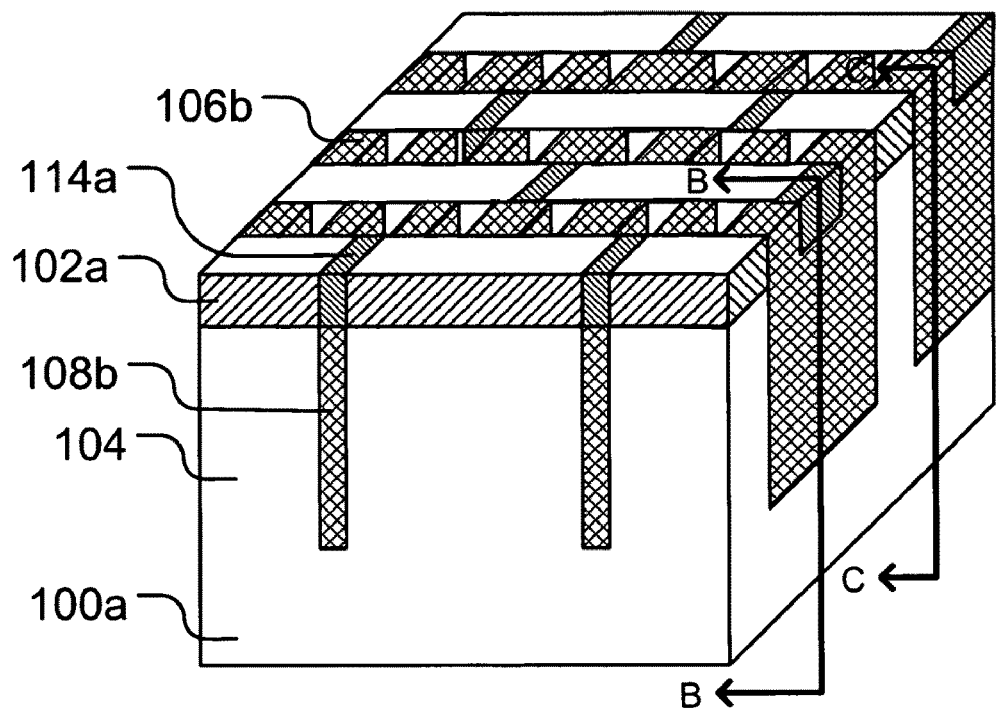
Figure 12B:
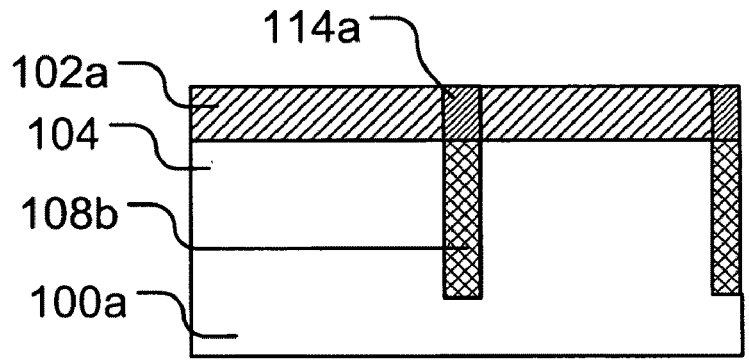
Figure 12C:
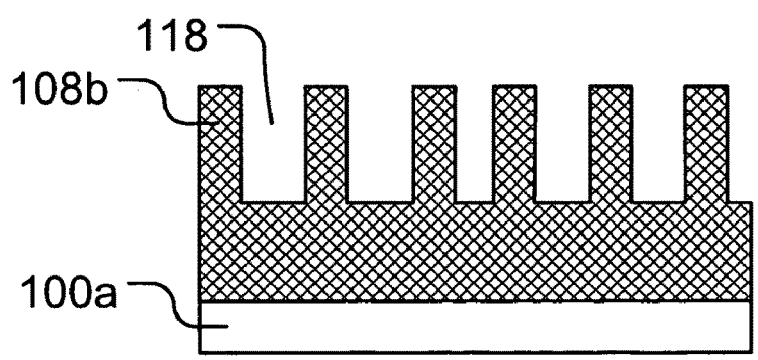

As illustrated in FIGS. 10A through 10C, a damascene pattern 116 is then formed on the surface of the structure illustrated in FIG. 9A to define those regions of the field insulating region 108a that will be removed for the subsequent formation of a gate dielectric layer and gate electrodes. As illustrated in FIG. 10B, portions of the first hard mask pattern 102a and second hard mask pattern 114a are exposed by the damascene pattern 116. As illustrated in FIGS. 11A through 11C, the exposed portions of the field insulating region 108a are then etched to form a number of recessed regions 118, FIG. 11C, in the lateral field insulating regions situated between adjacent active areas 104. As illustrated in FIG. 11B, however, those portions of the residual field insulating region 108b in the specific field insulating regions are protected by the second hard mask pattern 114a and are not, therefore, removed during the etch process. As illustrated in FIGS. 12A through 12C, the damascene pattern 116 is then removed and the substrate surface prepared for subsequent processing.

Figure 13A:
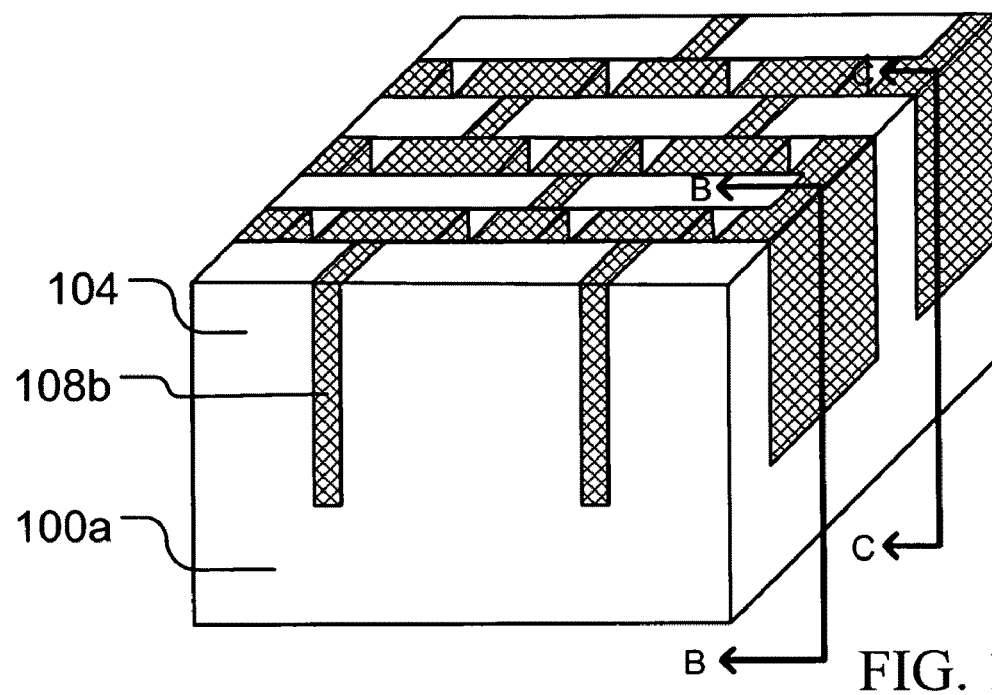
Figure 13B:
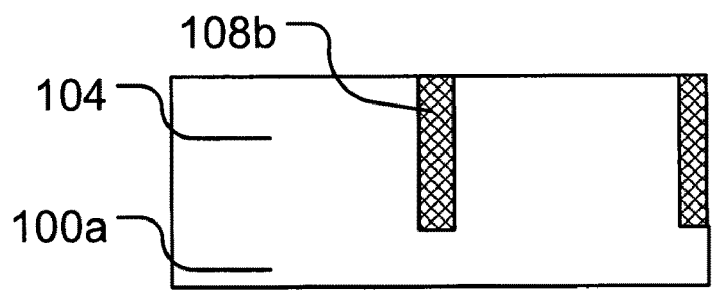
Figure 13C:
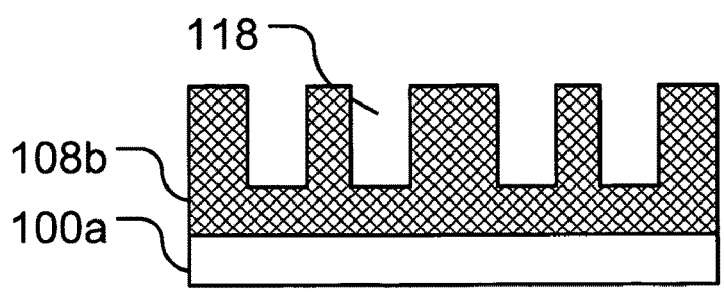

As illustrated in FIGS. 13A through 13C, the first hard mask pattern 102a and the second hard mask pattern 114a are then removed to expose the upper surface of the active regions 104 and the specific field insulating regions of the field insulating region 108b respectively. A single or multi-layer gate dielectric (not shown) may then be formed on the exposed surfaces of the active regions 104, including both the upper surface and the side surfaces exposed by the recessed regions 118.

Figure 14A:
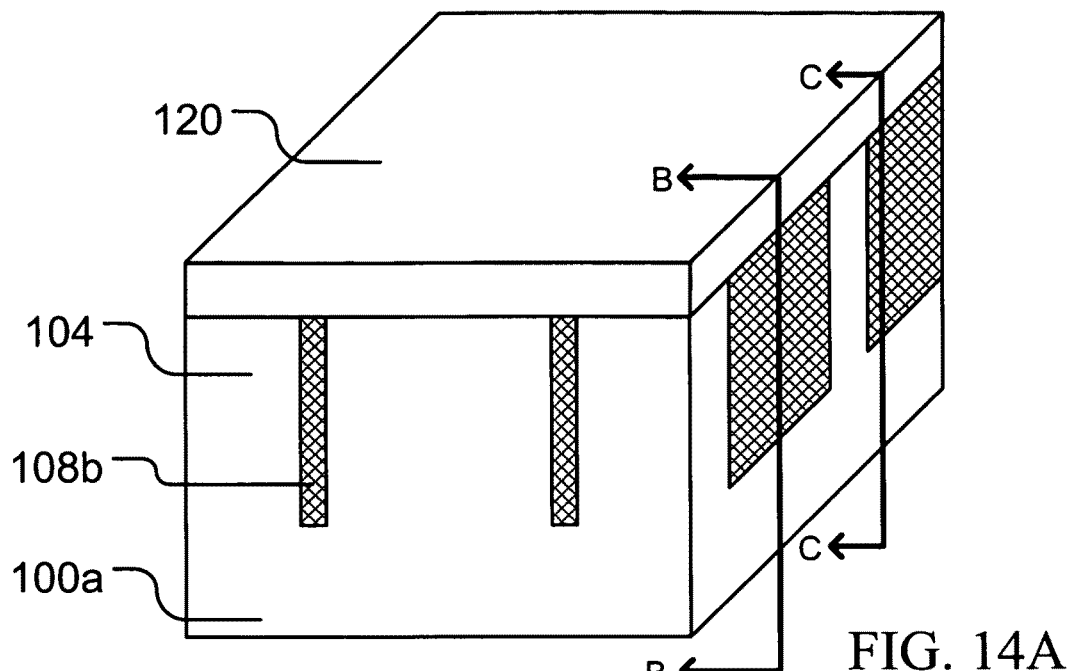
Figure 14B:
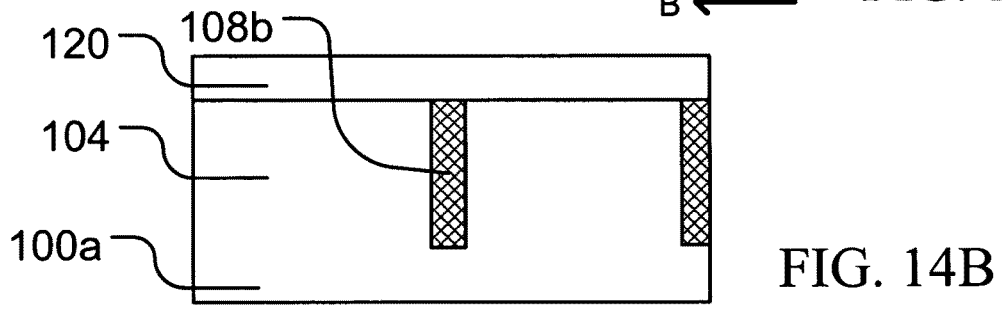
Figure 14C:
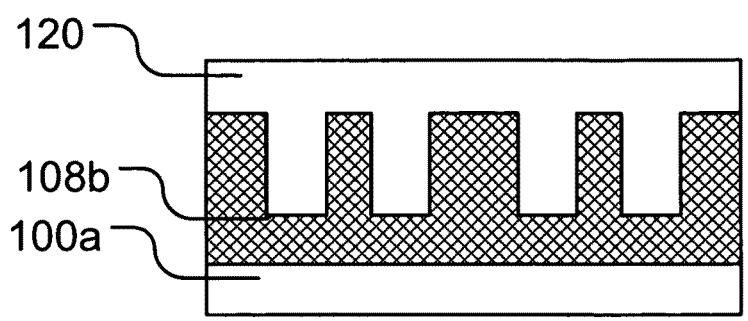
Figure 15A:
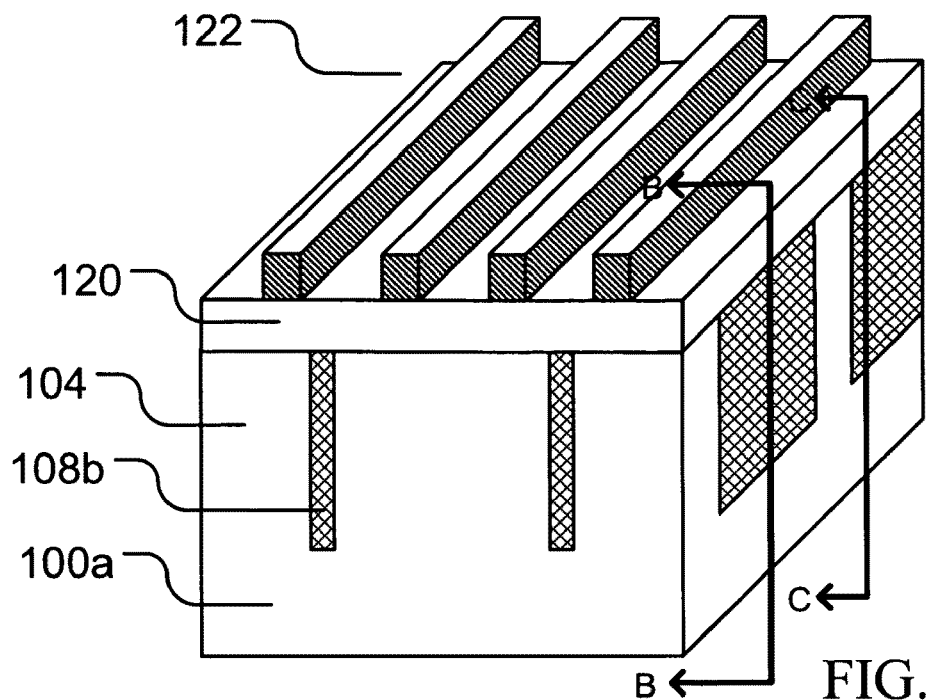
Figure 15B:
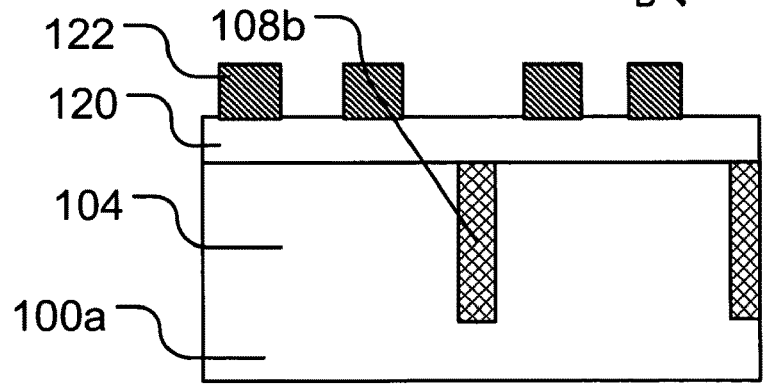
Figure 15C:
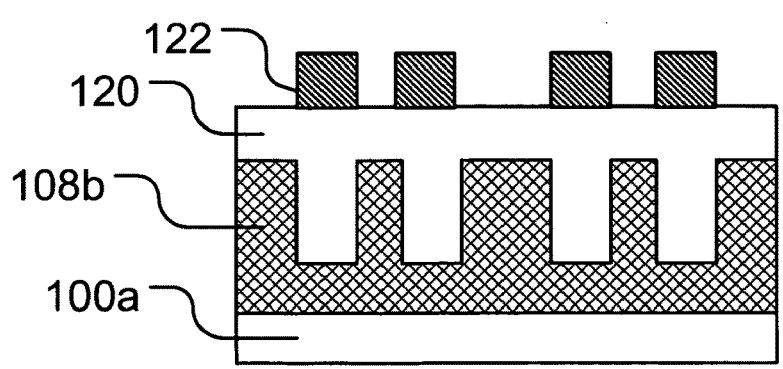
Figure 16A:
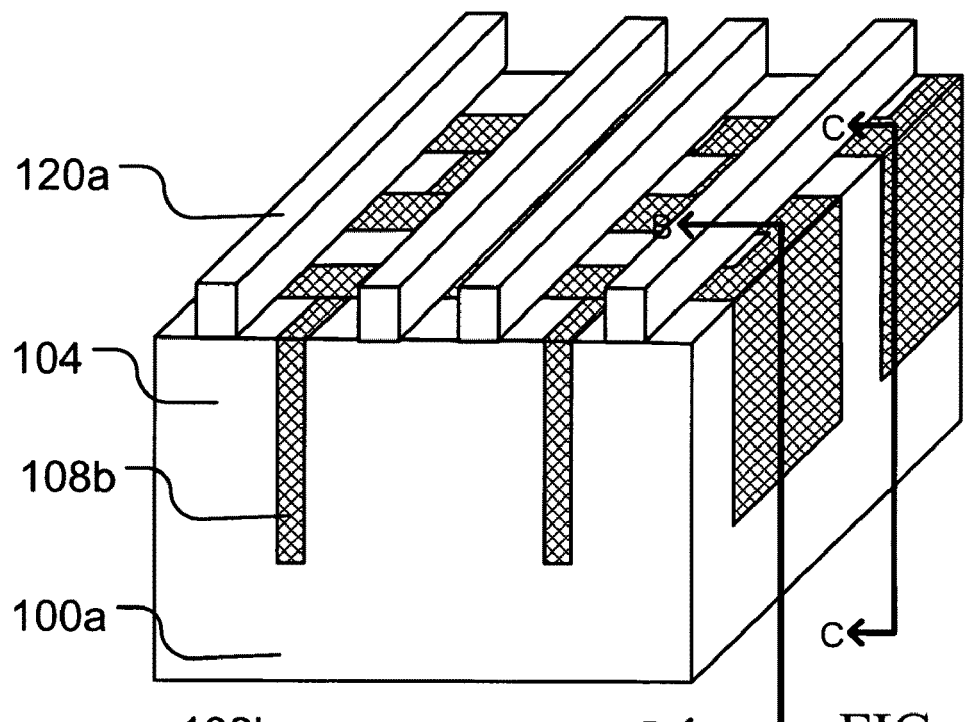
Figure 16B:
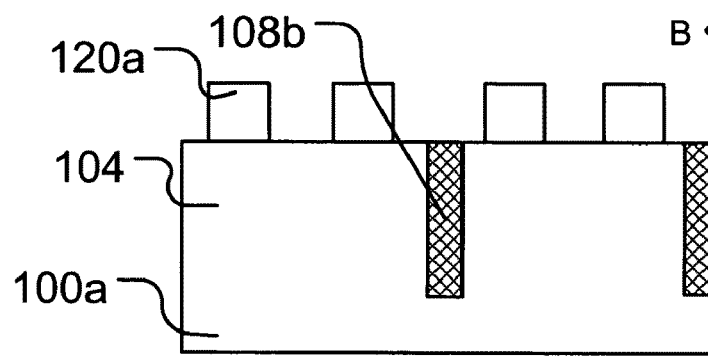
Figure 16C:
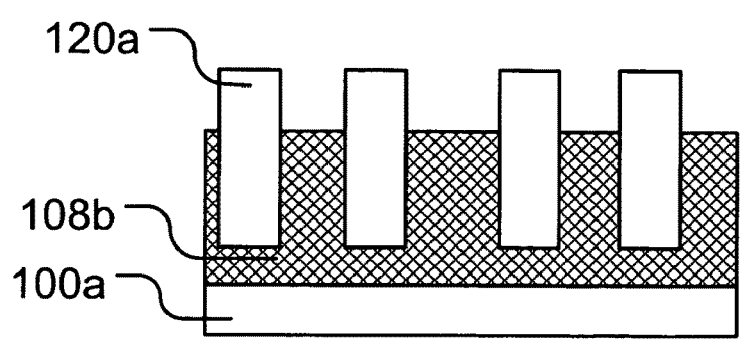

As illustrated in FIGS. 14A through 14C, a gate electrode layer 120 is then formed to a thickness sufficient to fill the recessed regions 118 and extend across the other exposed surfaces of the active regions 104 and the field insulting region 108b. As illustrated in FIGS. 15A through 15C, a gate electrode pattern 122 is then formed on the gate electrode layer 120 in order to protect those portions of the gate electrode layer that will become gate electrodes. As illustrated in FIGS. 16A through 16C, the portions of the gate electrode layer 120 exposed by the gate electrode pattern 122 are then removed using an appropriate etch to form the gate electrodes 120a. After the etch is complete, the gate electrode pattern 122 is removed and the substrate is prepared for additional processing.

An example embodiment of the method of forming the structures discussed above is illustrated in FIG. 17A, a photomicrograph of a device corresponding to FIG. 4A above, after deposition and planarization of the field insulating material 108. A cross-section taken across two aligned active regions 104 along line A-A' is illustrated in FIG. 17B. The processing of the substrate according to the example embodiment continues in FIGS. 18A and 18B in which the contact-type pattern 110 is formed to expose those specific field insulating regions between adjacent active areas 104 aligned along a single axis.

In the example embodiment illustrated in FIG. 17A, the active regions 104 have a dimension of about 180 nm along their major (longitudinal) axis and a dimension of about 50 nm along their minor (transverse) axis. The first hard mask pattern 102a comprises about 500 Å of SiN formed on a pad oxide layer having a thickness of about 100 Å. This first hard mask pattern is used to protect the upper surfaces of the active regions 104 during the trench etch during which a thickness of about 3000 Å of the original substrate material 100 is removed to define the elongated active region 104 structures in the residual upper portion of the substrate. The exposed semiconductor surfaces can then be protected with a thin pad oxide layer and a silicon nitride liner. The remaining portion of the trenches can then be filled with one or more insulating materials, for example, 3000 to 3200 Å of a silicon oxide, and then planarized to expose upper surfaces of the first hard mask pattern surrounded by field insulating material.

As illustrated in FIGS. 18A and 18B, a photoresist pattern 110 is then formed to expose portions of the field insulating material between adjacent active regions 104. Because the amount of the field insulating material being removed is not particularly large, the photoresist layer may be relatively thin, for example, about 1800 Å, depending on the exposure system, resist composition and etch chemistry being employed, to provide for improved dimensional control.

Although referred to as a "contact-type" mask, as will be appreciated by those skilled in the art, no contacts are being formed using this mask at this stage of the device fabrication process. Indeed, as used herein "contact-type" refers to the resulting array of relatively small openings formed across the surface of the substrate and its similarity to the subsequently formed contact patterns.

Further, although this pattern may be formed with a single mask, depending on the configuration of the underlying structures and the available masks, the "contact-type" mask according to the example embodiment may, in actuality, represent a composite exposure of two or more masks to obtain the desired opening configuration. Similarly, the photoresist may be subjected to additional treatments in order to obtain or maintain preferred critical dimensions. The openings formed may be generally round or ellipsoidal and will typically encompass terminal portions of the adjacent active regions 104 while simultaneously limiting the extension into the field insulating regions 108 between parallel rows of active regions.

Figures 22A, 22B:
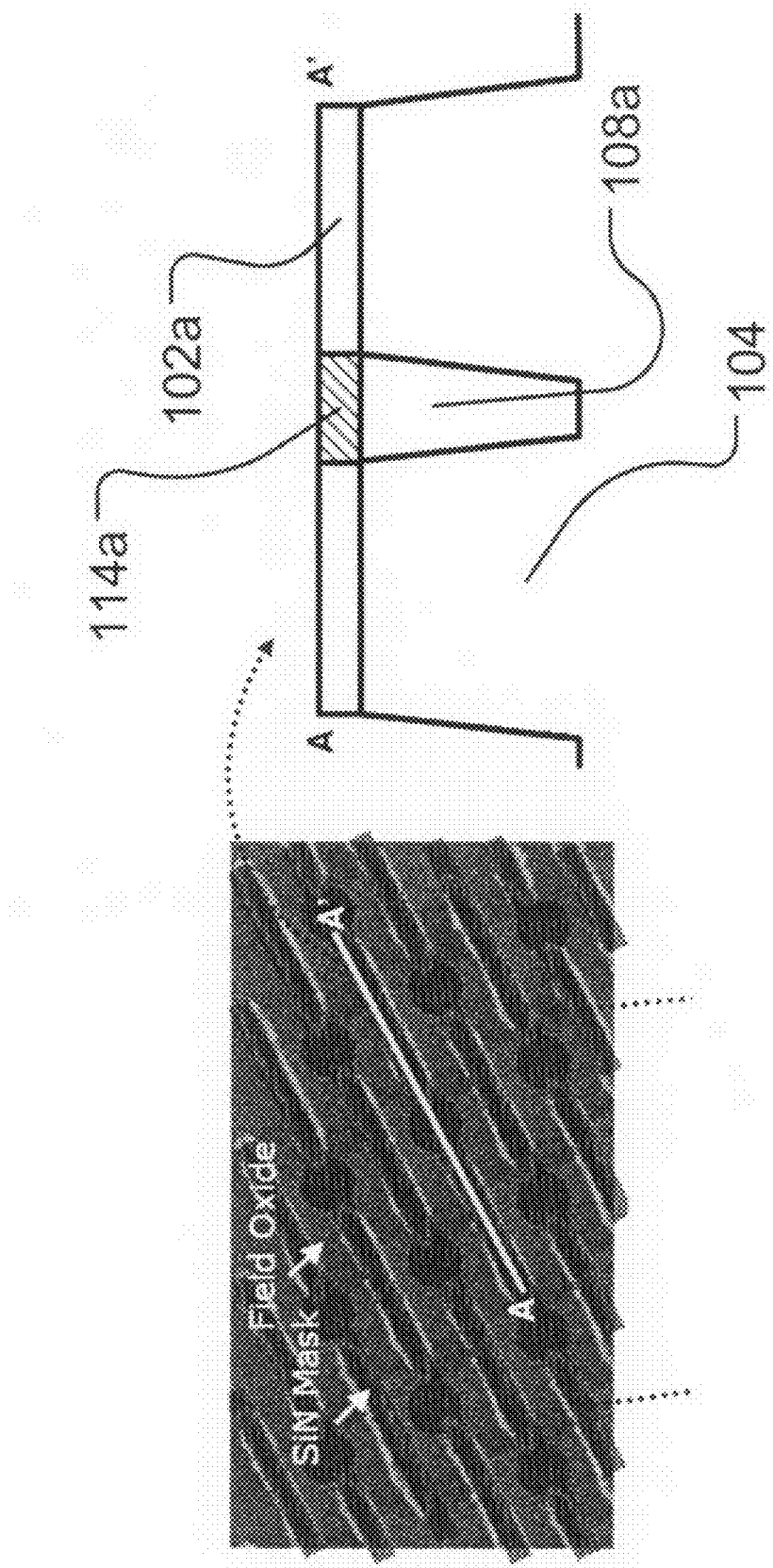

FIGS. 19-21 illustrate the formation of recessed regions 112 in the residual portion of the field insulating region 108a using the contact-type pattern 110 and corresponds generally to FIGS. 6A-8A as discussed above. As illustrated in FIGS. 22A and 22B, the recessed regions 112 are then filled with an insulating material, for example, silicon nitride, that provides greater etch resistance than the field insulating material. The resulting structure is then planarized to provide a heterogeneous surface comprising the upper surfaces of the first hard mask pattern 102a used to form the active regions 104, the residual field insulating regions 108a and the second hard mask pattern 114a.

As illustrated in FIG. 19, the thickness of the field insulating material removed from the specific field insulating area to form the recessed regions 112 generally corresponds to the thickness of the first hard mask pattern 102a, for example, about 400 Å, in this example embodiment. As illustrated in FIG. 20, the photoresist pattern 110 is then removed, for example, utilizing an ashing process and/or wet process to prepare the substrate for additional processing. As illustrated in FIG. 21, the second hard mask material layer 114 is then deposited to a thickness sufficient to fill the recessed regions 112. The material used in forming the second hard mask will be one that exhibits good resistance to the etch process(es) that will subsequently be used to open the recessed regions 118 in the field insulating region.

In this example embodiment for instance, if the field insulating region is a silicon oxide, the second hard mask material may be about 500 Å of silicon nitride, polysilicon or other material(s) that will provide sufficient etch selectivity to the field insulating material. Selecting first and second hard mask materials that are the same will tend to simplify the subsequent removal, but different materials may be used if the subsequent processing is or may be adapted to remove the two hard mask patterns sequentially or substantially simultaneously without unacceptable levels of damage to the underlying structures.

As illustrated in FIGS. 23A and 23B, the damascene pattern 116 is then formed to define those regions of the field insulating region 108a that will be removed to form the recesses adjacent portions of the active regions 104. As illustrated in FIGS. 24A and 24B, using the damascene pattern 116, portions of the field insulating region 108a are removed to form a second field insulating region 108b in which recesses having a depth less than the overall height of the action regions 104 are formed. Depending on the relative alignment of the damascene pattern 116, the active regions 104 and the axial offset between adjacent groups of aligned active regions, some of the open portions of the damascene pattern 116 will tend to expose at least some of the specific insulating regions formed between adjacent ones of a group of active regions 104 aligned along a single axis.

The relationship between these various regions is illustrated in FIGS. 26A and 26B. As illustrated in FIG. 26A, the specific insulating region between adjacent active regions 104, along with a portion of the field insulating region 108a, may be exposed to the etch chemistry in the open regions 116a, which may, for example, have a space width of about 35-45 nm, of the damascene pattern 116, which may, for example, have a photoresist line width of about 85-95 nm, i.e., the pattern lines being about two times the width of the corresponding alternating spaces, during formation of the recessed regions 118. The subsequent removal of the damascene pattern 116, the first hard mask pattern 102a and the second hard mask pattern 114a will produce the structure illustrated in FIGS. 25A and 25B.

Because the material added in the specific insulating region exhibits a greater resistance to the etch chemistry being used to form the recesses 118, the material between the active regions 104 is maintained at nearly its full thickness throughout the etch. In the example embodiment illustrated in FIGS. 24B and 25B, the depth of the recessed region 118 may be about 50% of the depth of the field insulating region 108, in this instance about 1500 to 1600 Å. As will be appreciated by those skilled in the art, however, these dimensions may be modified as necessary to compensate for various factors including, for example, more aggressive or less aggressive design rules, parametric properties, changes in materials and/or etch selectivity.

As illustrated in FIG. 26B, the use of the two hard mask patterns produces a structure having three distinct surfaces, 208a, 208b and 208c as reflected in a cross-section taken along line B-B' as indicated in FIG. 26A. The upper surface, 208a, corresponds to those portions of the field insulating region 108b that are not removed during formation of the recessed regions 118. The lower surface, 208c, corresponds to the bottom of the recessed regions 118 after the etch and before formation of the gate dielectric layer and gate electrode layer. The intermediate surface, 208b, corresponds to the surface in the specific field insulating regions after removal of the second hard mask.

The relative levels of these three insulating surfaces 208a, 208b, 208c, may be defined by their respective vertical offsets from a reference plane P corresponding to the upper surface of the active regions 104. As reflected in FIG. 26B, when the first hard mask pattern 102a is removed, the exposed surface of the active region 104 will be recessed relative to the surrounding unetched portions of the field insulating region 108b by a vertical offset distance $L_f$ from the reference plane P.

Conversely, removing portions of the field insulating region 108b to form the recessed regions 118 will produce a surface 208c that is recessed relative to the reference plane P by a vertical offset distance $L_d$. The intermediate surface 208b exposed by removal of the second hard mask pattern 114a, however, was subjected to an initial abbreviated or partial etch and then subsequently protected from the etch later used to remove other portions of the field insulating material to form the recessed regions 118. As a result, the intermediate surface 208b may exhibit a vertical offset distance in either a positive or a negative vertical direction relative to the reference plane P, but in either instance the magnitude of this vertical offset distance will be less than the magnitude of the vertical offsets $L_f$ and $L_d$ associated with the other surfaces 208a, 208c. For example, the intermediate surface 208b may be offset by less than 200 Å from the reference plane P, or even less than 100 Å, and will generally be offset in a positive vertical direction, i.e., upward relative to the reference plane P, to suppress or eliminate residual gate electrode material from the specific field insulating regions.

Figure 27:
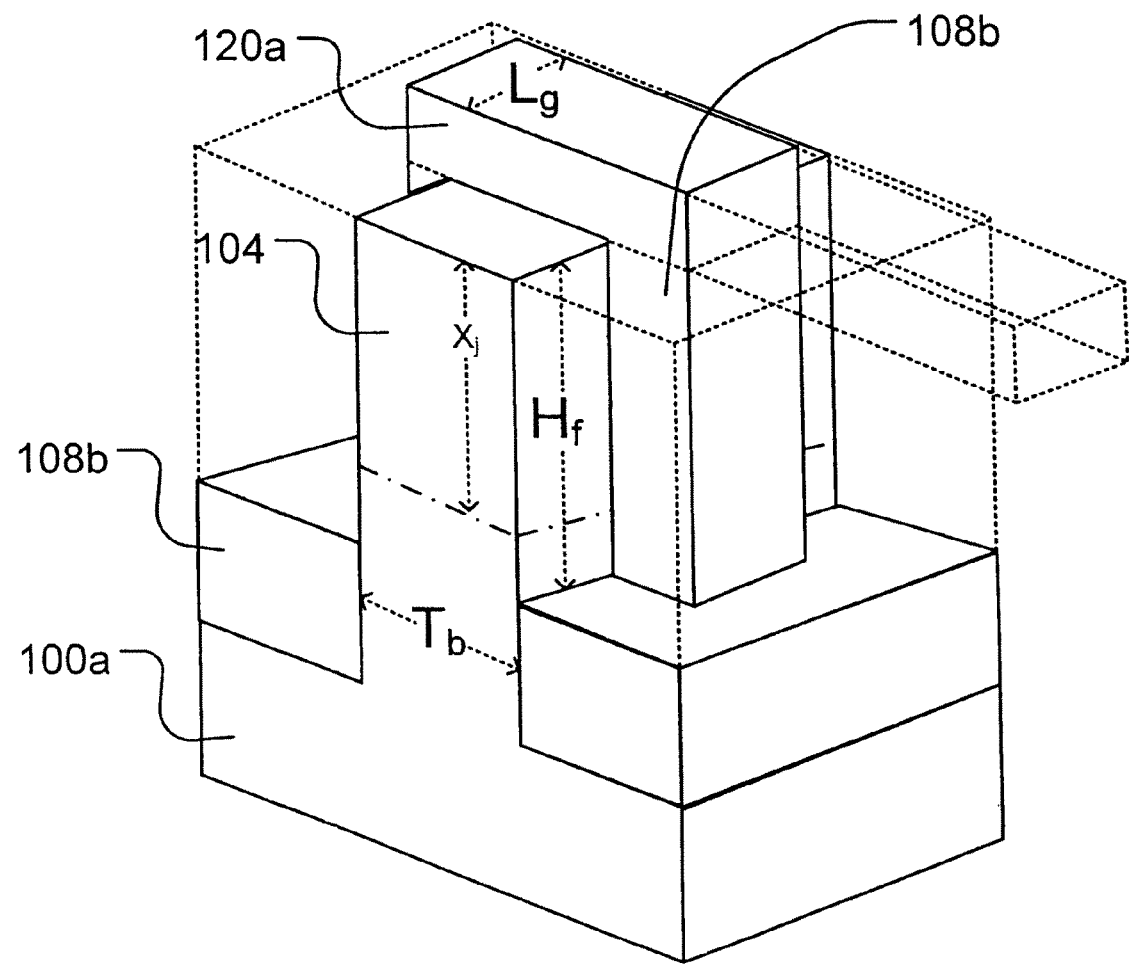
FIG. 27 is an orthogonal view of a portion of an active region with a gate electrode formed thereon with reference dimensions indicated.

As illustrated in FIG. 27, the basic field effect transistor structure utilized in the example embodiments will include an elongated thin body active region 104 having, along a minor axis, a thickness $T_b$, extending from a residual portion of the substrate 100a. The active region 104 is surrounded by a residual portion of the field insulating region 108b and is doped to provide a channel region having a depth $x_j$. The active region is also partially covered by a gate dielectric layer (not shown) and a gate electrode 120a having a gate length $L_g$ and extending along the vertical surface of the active region to define a fin height $H_f$ generally corresponding to the depth of the openings 118 formed in the field insulating regions during the damascene etch. As indicated by the dashed lines, portions of both the field insulating region and the gate electrode have been shown in phantom to better illustrate the underlying structures.

The use of a self-aligned local damascene ("SLD") according to the example embodiments may be used in a variety of device fabrication methods, for example, memory devices. The formation of the second hard mask pattern will tend to increase the tolerance for misalignment (M/A), i.e., the M/A margin, for the subsequent formation of the gate electrodes. Indeed, in some example embodiments, the MIA margin may be increased on the order of 100% or more over the M/A margin tolerated in conventional imaging will maintaining the production yield and performance of the resulting devices.

For example, as noted above, a generally round or ellipsoidal opening sized to encompass opposing ends of adjacent active regions 104 may be used to define a protected region including the specific field insulating region and some portion of the surrounding lateral field insulating region extending along the active regions. The oversized ellipsoidal opening allows for increased M/A margins which may be on the order of 28-30 nm depending on the critical dimensions (CD) of the particular elements that will cooperate to form functional portions of a semiconductor device. This improved M/A margin may also be utilized to extend the utility of the ArF imaging systems and to delay the need to adopt immersion ArF photolithography to obtain suitable image resolution, thereby improving productivity and/or reducing manufacturing costs.

Use of the methods according to the example embodiments may be incorporated in both recess cell array transistors ("RCAT") and spear-shaped recess cell array transistors ("SRCAT") using low voltage common collector ("LVCC") configurations and operation to provide structures exhibiting reduced leakage and improved subthreshold performance while still providing satisfactory and/or improved "on" current performance than conventional planar devices formed in the same surface area of the substrate.

As will be appreciated by those skilled in the art, there is no particular restriction on the relative orientation of the active regions and the gate electrodes that may be accommodated by methods according to the example embodiments. Recently, however, higher integration densities have been achieved with configurations in which the parallel axes of the groups of aligned active regions are offset by an angle θ, for example between 20° and 35°, from a perpendicular orientation relative to the gate electrodes. The increased M/A margin provided by the example embodiments of the current method will become increasingly significant as the design rules are reduced, thereby improving or maintaining yields and device reliability even as the critical dimensions are reduced for the production of future generations of devices.

As will be appreciated, other techniques may be incorporated with the methods according to the example embodiments for further improving the performance of the resulting devices. For example, rather than the conventional n-doped polysilicon gate electrode material, other materials may be adopted for improving the threshold voltage control. One such material is p+-doped polysilicon which can increase the threshold voltage of n-channel transistors by as much as 0.8 V or more. Work function engineering using differential doping of the gate electrodes in CMOS devices can be used to provide increased threshold voltages for both p-channel and n-channel devices. Similarly, use of appropriate semiconductor substrates may allow the use of body-bias techniques for improved control of the threshold voltages.

The presence of the residual field insulating material in the specific field regions, particularly to the extent that it overlaps terminal portions of one or both of the adjacent active regions 104 and has a surface 208b having relatively little, if any, vertical offset from the reference plane P defined by the surfaces of the active regions 104, improves the performance of the resulting devices. This improvement results, in part, from reducing or eliminating the formation of extraneous "gate electrode" structures between adjacent ones of the active regions 104.

The resulting devices, therefore, will tend to exhibit reduced leakage relative to devices formed according to conventional methods in which the opposing ends of adjacent active regions may be partially encompassed by a "gate electrode" structure. Accordingly, therefore, the functional performance and reliability of the resulting devices may be improved.

We claim:

1. A FinFET structure comprising:
    a field insulating region defining an active region in a semiconductor substrate and having a concave portion and a convex portion on a surface of the field insulating region, the active region having longitudinal and lateral axes, the concave portion being disposed along the lateral axis, a surface of the concave portion being located at a lower level than a top surface of the active region and the convex portion confining the concave portion around the active region; and
    a gate electrode disposed on the active region and the field insulating region to fill the concave portion in the field insulating region.

2. The FinFET structure according to claim 1, wherein the concave portion is disposed along at least one sidewall of the active region to partially expose the sidewall of the active region.

3. The FinFET structure according to claim 1, wherein the concave portion is disposed in pairs along a sidewall of the active region to partially expose the sidewall of the active region.

4. The FinFET structure according to claim 1, wherein the concave portion is disposed between both edges of the active region along the longitudinal axis.

5. The FinFET structure according to claim 1, wherein the concave portion has one of a perpendicular shape and an oblique shape with respect to the longitudinal axis of the active region.

6. The FinFET structure according to claim 1, wherein the gate electrode contacts a sidewall of the active region in the concave portion of the field insulating region.

7. A FinFET structure comprising:
    a field insulating region defining active regions in a semiconductor substrate and having concave portions and a convex portion on a surface of the field insulating region, the respective active regions having longitudinal and lateral axes, the respective concave portions being disposed along the lateral axes of the respective active regions, surfaces of the respective concave portions being located at a lower level than a reference plane defined by surfaces of the active regions and the convex portion confining the concave portions around the active regions; and
    gate electrodes disposed on the active regions and the field insulating region to fill the concave portions in the field insulating region.

8. The FinFET structure according to claim 7, wherein the respective concave portions are disposed perpendicularly with respect to the longitudinal axes of the respective active regions.

9. The FinFET structure according to claim 7, wherein the respective concave portions are disposed obliquely with respect to the longitudinal axes of the respective active regions.

10. The FinFET structure according to claim 7, wherein the respective concave portions partially expose sidewalls of adjacent two active regions.

11. The FinFET structure according to claim 7, wherein the respective convex portions are disposed between both edges of the respective active regions along the respective longitudinal axes.

12. The FinFET structure according to claim 7, wherein the respective gate electrodes contact sidewalls of the respective active regions in the respective concave portions of the field insulating region.

* * * * *